(12) United States Patent
Kim et al.

(10) Patent No.: US 11,450,133 B2
(45) Date of Patent: Sep. 20, 2022

(54) ULTRASONIC SENSING DEVICE AND DISPLAY DEVICE INCLUDING THE SAME

(71) Applicant: Samsung Display Co., Ltd., Yongin-si (KR)

(72) Inventors: Keun Woo Kim, Seongnam-si (KR); Doo Na Kim, Cheonan-si (KR); Ji Yeong Shin, Suwon-si (KR); Yong Su Lee, Seoul (KR); Jae Hwan Chu, Hwaseong-si (KR); Ki Seok Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/824,475

(22) Filed: Mar. 19, 2020

(65) Prior Publication Data

US 2020/0410192 A1    Dec. 31, 2020

(30) Foreign Application Priority Data

Jun. 25, 2019  (KR) ......................... 10-2019-0075410

(51) Int. Cl.
*G06V 40/13*   (2022.01)
*G06F 3/043*   (2006.01)
(Continued)

(52) U.S. Cl.
CPC ......... *G06V 40/1306* (2022.01); *G01B 17/00* (2013.01); *G01B 17/06* (2013.01);
(Continued)

(58) Field of Classification Search
CPC . G06K 9/0002; H01L 41/0825; H01L 27/323; H01L 27/3225; G01B 17/06;
(Continued)

(56) References Cited

U.S. PATENT DOCUMENTS

2011/0198484 A1* 8/2011 Kurokawa ........... G09G 3/3648
250/214 R
2013/0088460 A1* 4/2013 Ahn ....................... G06F 3/0412
345/175

(Continued)

FOREIGN PATENT DOCUMENTS

KR    10-2012-0135406 A    12/2012
KR    10-2013-0037072 A     4/2013
(Continued)

OTHER PUBLICATIONS

Prasad et al, Analytical Modeling of Surface Potential for Double-Gate MOSFET (Year: 2019).*

(Continued)

*Primary Examiner* — David L Singer
(74) *Attorney, Agent, or Firm* — Lewis Roca Rothgerber Christie LLP

(57) ABSTRACT

An ultrasonic sensing device includes: a sensing layer between a driving electrode and a sensing electrode, a double-gated first transistor connected to a selection line and the sensing electrode, and may further include a sensed voltage storing capacitor having an electrode on the same layers as the first transistor. The configuration as a double gated transistor of a pixel sensor and the placement of one of the capacitor electrodes on the same layer can each reduce the size of the pixel sensor. The ultrasonic sensing device may be utilized as a proximity sensor or a fingerprint recognition sensor.

27 Claims, 17 Drawing Sheets

(51) Int. Cl.
  *G01B 17/00* (2006.01)
  *H01L 41/08* (2006.01)
  *G06F 3/041* (2006.01)
  *H01L 27/32* (2006.01)
  *G01B 17/06* (2006.01)
  *G01B 17/08* (2006.01)
(52) U.S. Cl.
  CPC ............. *G01B 17/08* (2013.01); *G06F 3/043* (2013.01); *G06F 3/0412* (2013.01); *H01L 27/323* (2013.01); *H01L 41/0825* (2013.01)
(58) Field of Classification Search
  CPC ....... G01B 17/08; G01B 17/00; G06F 3/0412; G06F 3/0433; G06F 3/0416; G06F 3/043–0436; G06F 3/0445; G01N 29/34–348; G06V 40/1306
  See application file for complete search history.

(56) References Cited

U.S. PATENT DOCUMENTS

| | | | | |
|---|---|---|---|---|
| 2014/0352440 | A1* | 12/2014 | Fennell | G01N 29/22 73/632 |
| 2014/0354596 | A1* | 12/2014 | Djordjev | G06F 3/0421 345/175 |
| 2014/0355376 | A1* | 12/2014 | Schneider | G01S 15/02 367/7 |
| 2015/0016223 | A1* | 1/2015 | Dickinson | G06F 3/0436 367/87 |
| 2015/0241393 | A1* | 8/2015 | Ganti | G01N 29/09 73/589 |
| 2016/0132713 | A1* | 5/2016 | Bae | G06K 9/0014 345/174 |
| 2017/0059699 | A1* | 3/2017 | Mathe | A61B 5/117 |
| 2017/0090028 | A1* | 3/2017 | Djordjev | G01S 7/521 |
| 2017/0242516 | A1* | 8/2017 | Bae | G06F 3/0412 |
| 2017/0351364 | A1* | 12/2017 | Kim | G06K 9/001 |
| 2017/0364188 | A1* | 12/2017 | Bae | G06K 9/0014 |
| 2018/0026223 | A1* | 1/2018 | Choi | B32B 27/36 428/76 |
| 2018/0143669 | A1* | 5/2018 | Bok | G06F 1/1626 |
| 2018/0203537 | A1* | 7/2018 | Kim | G06F 3/0412 |
| 2019/0057236 | A1 | 2/2019 | Liu et al. | |
| 2019/0079186 | A1 | 3/2019 | Taghibakhsh | |
| 2019/0197281 | A1* | 6/2019 | Choi | G06K 9/209 |
| 2019/0197282 | A1* | 6/2019 | Gong | G06F 3/0412 |
| 2019/0205593 | A1* | 7/2019 | Kim | H01L 51/5237 |
| 2019/0205594 | A1* | 7/2019 | Lee | G06F 1/1684 |
| 2019/0205595 | A1* | 7/2019 | Gong | G06F 1/1643 |
| 2019/0205596 | A1* | 7/2019 | Kim | B06B 1/0692 |
| 2019/0205603 | A1* | 7/2019 | Lee | G06K 9/0002 |
| 2020/0160021 | A1* | 5/2020 | Feng | G06F 3/04166 |

FOREIGN PATENT DOCUMENTS

| | | |
|---|---|---|
| KR | 10-2018-0048919 A | 5/2018 |
| KR | 10-2018-0085097 A | 7/2018 |

OTHER PUBLICATIONS

Weis M., et al., "Circuit design with Independent Double Gate Transistors," Advances in Radio Science, vol. 7, 2009, pp. 231-236.

* cited by examiner

ULTRASONIC SENSING DEVICE AND DISPLAY DEVICE INCLUDING THE SAME

CROSS-REFERENCE TO RELATED APPLICATION

The present application claims priority to and the benefit of Korean Patent Application No. 10-2019-0075410, filed on Jun. 25, 2019, which is hereby incorporated by reference for all purposes as if fully set forth herein.

BACKGROUND

1. Field

Aspects of some example embodiments/implementations of the invention relate generally to an ultrasonic sensing device and a display device including the same.

2. Description of the Related Art

As the information society develops, the demand for display devices for displaying images is increasing in various forms. For example, display devices are being utilized with various electronic devices such as smartphones, digital cameras, notebook computers, navigation devices, and smart televisions.

With the use of display devices in various electronic devices, display devices having various functions may be desired. For example, a smartphone may include an ultrasonic sensing device for sensing ultrasonic waves. The ultrasonic sensing device may be utilized as a proximity sensor or a fingerprint recognition sensor.

The above information disclosed in this Background section is only for understanding of the background of the inventive concepts, and, therefore, it may contain information that does not constitute prior art.

SUMMARY

Devices constructed according to some example implementations of the invention may include a display device including an ultrasonic sensing device having a pixel sensor with a relatively reduced area.

Additional features of some example embodiments of the inventive concepts will be set forth in the description which follows, and in part will be apparent from the description, or may be learned by practice of the inventive concepts.

According to one or more example embodiments of the invention, an ultrasonic sensing device includes: a sensing layer between a driving electrode and a sensing electrode, the sensing layer generating an electrical signal according to an ultrasound; and a first transistor which includes a first gate electrode connected to a selection line and a second gate electrode connected to the sensing electrode.

According to one or more example embodiments of the invention, an ultrasonic sensing device includes: a sensing layer between a driving electrode and a sensing electrode, the sensing layer generating an electrical signal according to an ultrasound; and a second transistor which includes a first gate electrode connected to an initialization line, a second gate electrode and a first electrode connected to a control voltage line, and a second electrode connected to the sensing electrode.

According to one or more example embodiments of the invention, a display device includes: a display panel which comprises a pixel array layer on a surface of a substrate and displays an image using pixels; and an ultrasonic sensor which comprises an ultrasonic emitting device on the other surface opposite the surface of the substrate and emitting ultrasonic waves and an ultrasonic sensing device sensing ultrasonic waves reflected by an object on the display panel, wherein the ultrasonic sensing device comprises: a sensing layer between a driving electrode and a sensing electrode, the sensing layer generating an electrical signal according to an ultrasound; a first transistor under the piezoelectric layer, the first transistor including a first gate electrode to which a sensing voltage of the sensing electrode is applied; and a first capacitor electrode connected to the first gate electrode of the first transistor and a second capacitor electrode under the first capacitor electrode.

According to the aforementioned and other example embodiments of the present disclosure, a first transistor of a pixel sensor includes a first gate electrode connected to a selection line and a second gate electrode connected to a sensing electrode and is controlled by a selection signal and a voltage of the sensing electrode. That is, the first transistor may be a combination of a transistor controlled by the selection signal and a transistor controlled by the voltage of the sensing electrode. Therefore, because the pixel sensor includes one transistor as the first transistor, the area of the pixel sensor may be reduced as compared when the pixel sensor includes two transistors.

Also, according to some example embodiments, a second transistor of the pixel sensor includes a first gate electrode connected to an initialization line and a second gate electrode and a first electrode connected to a control voltage line. Therefore, the second transistor may be a combination of a transistor and a diode. Because the pixel sensor includes one transistor, into which the transistor and the diode are combined, as the second transistor, the area of the pixel sensor may be reduced as compared with when the pixel sensor includes two elements, for example, the transistor and the diode.

Moreover, according to some example embodiments, the second gate electrode of the first transistor and a first capacitor electrode of a capacitor are on the same layer and directly contact and are connected to each other, and the first capacitor electrode overlaps a second capacitor electrode in the third direction which is the thickness direction. Therefore, an area where the first transistor and the capacitor are formed can be minimized, thereby reducing the area of the pixel sensor.

Further, according to some example embodiments, a first ultrasonic sensor and a second ultrasonic sensor on a lower surface of a display panel may be utilized as a fingerprint recognition sensor and a proximity sensor. Therefore, holes that expose a fingerprint recognition sensor and a proximity sensor on a front surface of the display panel can be removed. This may minimize or reduce a bezel of the display device, thereby enabling a relatively wider a display area of the display device.

Other features and example embodiments may be apparent from the following detailed description, the drawings, and the claims.

It is to be understood that both the foregoing general description and the following detailed description describes aspects of some example embodiments and is intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate aspects of some example embodiments of the invention, and together with the description serve to explain the inventive concepts.

DETAILED DESCRIPTION

Figure 1:
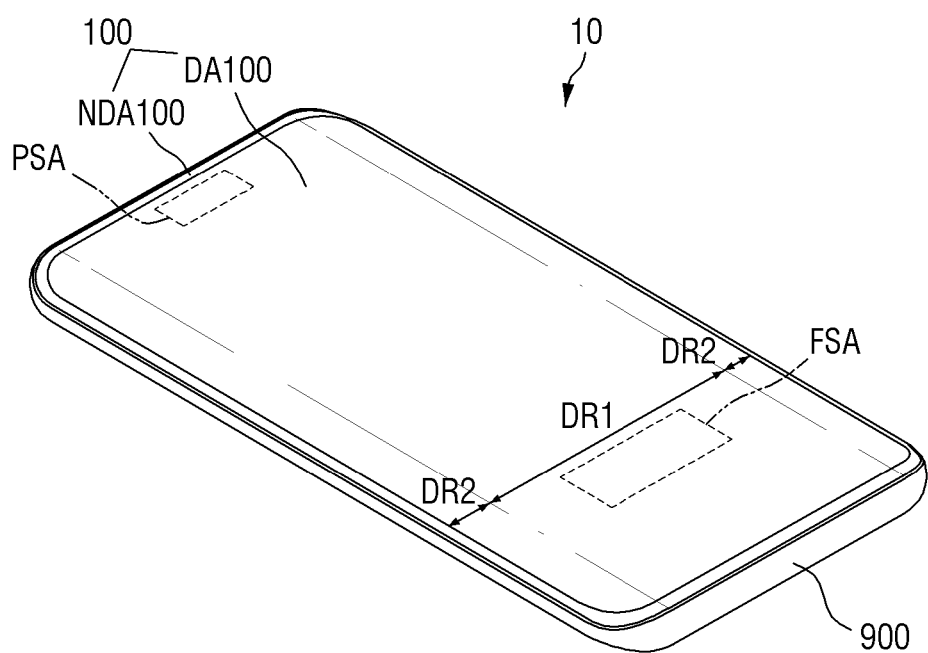
FIG. 1 is a perspective view of a display device according to some example embodiments.

In the following description, for the purposes of explanation, numerous specific details are set forth in order to provide a thorough understanding of various example embodiments or implementations of the invention. As used herein "embodiments" and "implementations" are interchangeable words that are non-limiting examples of devices or methods employing one or more of the inventive concepts disclosed herein. It is apparent, however, that various example embodiments may be practiced without these specific details or with one or more equivalent arrangements. In other instances, well-known structures and devices are shown in block diagram form in order to avoid unnecessarily obscuring various example embodiments. Further, various example embodiments may be different, but do not have to be exclusive. For example, specific shapes, configurations, and characteristics of an example embodiment may be used or implemented in another example embodiment without departing from the inventive concepts.

Unless otherwise specified, the illustrated example embodiments are to be understood as providing example features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an example embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the"

are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various example embodiments are described herein with reference to sectional and/or exploded illustrations that are schematic illustrations of idealized example embodiments and/or intermediate structures. As such, variations from the shapes of the illustrations as a result, for example, of manufacturing techniques and/or tolerances, are to be expected. Thus, example embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some example embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the inventive concepts. Further, the blocks, units, and/or modules of some example embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
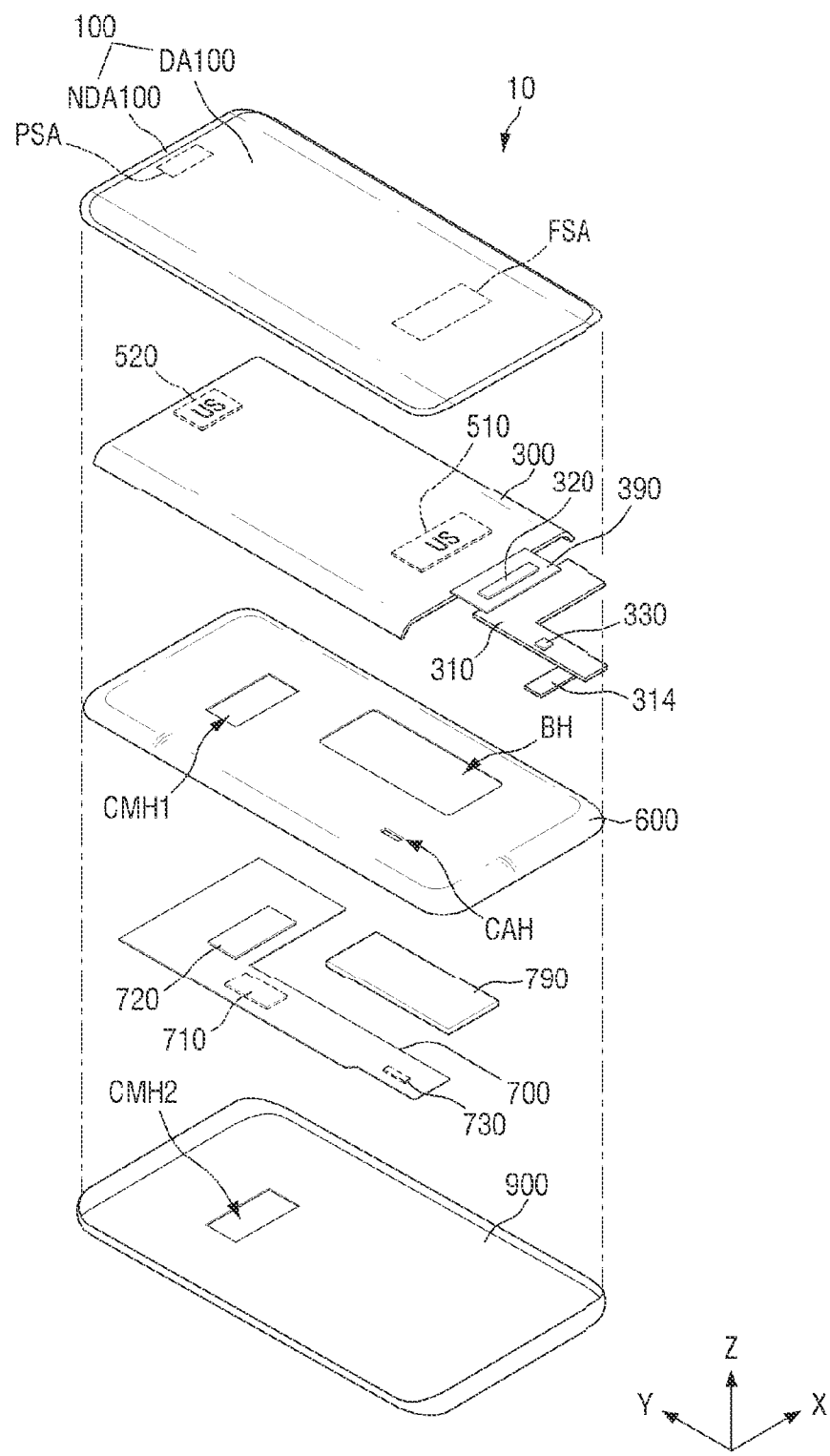
FIG. 2 is an exploded perspective view of the display device according to some example embodiments.

FIG. 1 is a perspective view of a display device 10 according to some example embodiments. FIG. 2 is an exploded perspective view of the display device 10 according to some example embodiments.

Referring to FIGS. 1 and 2, the display device 10, According to some example embodiments, includes a cover window 100, a display panel 300, a display circuit board 310, a display driver circuit 320, a flexible film 390, a first ultrasonic sensor 510, a second ultrasonic sensor 520, a bracket 600, a main circuit board 700, and a bottom cover 900.

In the present specification, the term "above" indicates a direction in which the cover window 100 is positioned or arranged with respect to the display panel 300, that is, a Z-axis direction, and the term "below" indicates a direction in which the bracket 600 is positioned or arranged with respect to the display panel 300, that is, a direction opposite to the Z-axis direction. In addition, "left," "right," "upper" and "lower" indicate directions when the display panel 300 is seen in a plan view. For example, "left" indicates a direction opposite to an X-axis direction, "right" indicates the X-axis direction, "upper" indicates a Y-axis direction, and "lower" indicates the direction opposite to a direction opposite to the Y-axis direction.

The display device 10 is a device for displaying moving images or still images. The display device 10 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation systems and ultra-mobile PCs (UMPCs), as well as in various products such as televisions, notebook computers, monitors, billboards and the Internet of things (IoT).

The display device 10 may be rectangular in plan view (e.g., when viewed from a perspective normal or perpendicular with respect to a plane of the display surface). For example, the display device 10 may have a rectangular planar shape having short sides in a first direction (X-axis direction) and long sides in a second direction (Y-axis direction) as illustrated in FIGS. 1 and 2. Each corner where a short side extending in the first direction (X-axis direction) meets a long side extending in the second direction (Y-axis direction) may be rounded with a curvature (e.g., a set or predetermined curvature) or may be right-angled. The planar shape of the display device 10 is not limited to the rectangular shape, but may also be another polygonal shape, a circular shape, an elliptical shape, or any other suitable shape according to the design of the display device 10.

The display device 10 may include a first area DR1 formed flat and a second area DR2 extending from right and left sides of the first area DR1. The second area DR2 may be formed flat or curved. When the second area DR2 is formed flat, an angle formed by the first area DR1 and the second area DR2 may be an obtuse angle. When the second area DR2 is formed curved, it may have a constant curvature or a varying curvature.

In FIG. 1, the second area DR2 extends from each of the right and left sides of the first area DR1. However, embodiments are not limited thereto. That is, according to some example embodiments the second area DR2 may also extend from only one of the right and left sides of the first area DR1. Alternatively, the second area DR2 may extend not only from the right and left sides of the first area DR1 but also from at least any one of upper and lower sides of the first area DR1. An embodiment where the second area DR2 is located at right and left edges of the display device 10 will be mainly described below.

The cover window 100 may be located on the display panel 300 to cover an upper surface of the display panel 300. Thus, the cover window 100 may function to protect the upper surface of the display panel 300.

The cover window 100 may be located in the first area DR1 and the second areas DR2. The cover window 100 may include a light transmitting portion DA100 corresponding to the display panel 300 and a light shielding portion NDA100 corresponding to an area other than the display panel 300. The light transmitting portion DA100 may be located in the first area DR1 and the second areas DR2. The light shielding portion NDA100 may be formed opaque. Alternatively, the light shielding portion NDA100 may be formed as a decorative layer having a pattern that may be shown to (or visible by) a user when an image is not displayed.

The display panel 300 may be located under the cover window 100. The display panel 300 may be overlapped by the light transmitting portion 100DA of the cover window 100. The display panel 300 may be located in the first area DR1 and the second areas DR2. Therefore, an image of the display panel 300 can be seen not only in the first area DR1 but also in the second areas DR2 through the cover window 100. That is, an image displayed on the display panel 300 can be seen on the upper surface and left and right edges of the display device 10 through the cover window 100.

The display panel 300 may be a light emitting display panel including light emitting elements. For example, the display panel 300 may be an organic light emitting display panel using organic light emitting diodes that include organic light emitting layers, a micro light emitting diode display panel using micro light emitting diodes, a quantum dot light emitting display panel including quantum dot light emitting diodes that include quantum dot light emitting layers, an inorganic light emitting display panel using inorganic light emitting elements that include inorganic semiconductors, or any other suitable display panel according to the design of the display device 10. An embodiment in which the display panel 300 is an organic light emitting display panel will be mainly described below.

The display circuit board 310 and the display driver circuit 320 may be attached to a side of the display panel 300. An end of the display circuit board 310 may be attached onto pads provided on the side of the display panel 300 by using an anisotropic conductive film. The display circuit board 310 may be a flexible printed circuit board that can be bent (e.g., without damaging the display circuit board 310), a rigid printed circuit board that is rigid and not easily bent, or a composite printed circuit board including both a rigid printed circuit board and a flexible printed circuit board.

The display driver circuit 320 receives control signals and power supply voltages through the display circuit board 310 and generates and outputs signals and voltages for driving the display panel 300. The display driver circuit 320 may be formed as an integrated circuit and attached onto the display panel 300 using a chip-on glass (COG) method, a chip-on plastic (COP) method, or an ultrasonic method. However, embodiments are not limited thereto. For example, according to some example embodiments, the display driver circuit 320 may be attached onto the display circuit board 310.

A touch driver circuit 330 may be located on the display circuit board 310. The touch driver circuit 330 may be formed as an integrated circuit and attached to an upper surface of the display circuit board 310. The touch driver circuit 330 may be electrically connected to touch electrodes of a touch sensor layer of the display panel 300 through the display circuit board 310. The touch driver circuit 330 may transmit touch driving signals to driving electrodes among the touch electrodes and output touch data including a user's touch coordinates by detecting amounts of charge change in capacitances between the driving electrodes and sensing electrodes among the touch. In addition, a power supply unit may be additionally located on the display circuit board 310 to supply display driving voltages for driving the display driver circuit 320.

A side of the flexible film 390 may be attached onto the upper surface of the display panel 300 at a lower side of the display panel 300 using an anisotropic conductive film. The other side of the flexible film 390 may be attached onto the upper surface of the display circuit board 310 at an upper side of the display circuit board 310 using an anisotropic conductive film. The flexible film 390 may be a flexible film that can be bent.

According to some example embodiments, the flexible film 390 may be omitted, and the display circuit board 310 may be directly attached to the side of the display panel 300. In this case, the side of the display panel 300 may be bent toward a lower surface of the display panel 300.

The first ultrasonic sensor 510 and the second ultrasonic sensor 520 may be located on the lower surface of the display panel 300. Each of the first ultrasonic sensor 510 and the second ultrasonic sensor 520 may be attached to the lower surface of the display panel 300 by an adhesive member such as a pressure sensitive adhesive (PSA).

Alternatively, the first ultrasonic sensor 510 and the second ultrasonic sensor 520 may be integrally formed with the display panel 300. For example, a substrate SUB1 of the display panel 300 illustrated in FIG. 4 may be omitted, and a buffer layer 302 may be located on the first ultrasonic sensor 510 and the second ultrasonic sensor 520.

Alternatively, a part of the first ultrasonic sensor 510 and a part of the second ultrasonic sensor 520 may be integrally formed with the display panel 300. For example, an ultrasonic sensing device 1520 of the first ultrasonic sensor 510 illustrated in FIG. 5 and an ultrasonic sensing device of the second ultrasonic sensor 520 may be integrally formed with the display panel 300, and an ultrasonic emitting device 1510 of the first ultrasonic sensor 510 and an ultrasonic emitting device of the second ultrasonic sensor 520 may be attached to the lower surface of the display panel 300, for example, by adhesive members such as PSAs. The ultrasonic sensing device 1520 of the first ultrasonic sensor 510 and the ultrasonic sensing device of the second ultrasonic sensor 520 may be located between the substrate SUB1 and the buffer layer 302 of the display panel 300 illustrated in FIG. 4. The ultrasonic emitting device 1510 of the first ultrasonic sensor 510 and the ultrasonic emitting device of the second ultrasonic sensor 520 may be located on a lower surface of the substrate SUB1 of the display panel 300.

The first ultrasonic sensor 510 may be located adjacent to the lower side of the display panel 300, and the second ultrasonic sensor 520 may be located adjacent to an upper side of the display panel 300. The position of the first ultrasonic sensor 510 and the position of the second ultrasonic sensor 520 are not limited to those illustrated in FIG. 2. Each of the first ultrasonic sensor 510 and the second ultrasonic sensor 520 may be located in an area not overlapping the display circuit board 310 bent toward the lower surface of the display panel 300, a cable 314, and a first camera hole CMH1 and a battery hole BH of the bracket 600. Alternatively, any one of the first ultrasonic sensor 510 and the second ultrasonic sensor 520 may be omitted, and the other may be arranged on the entire lower surface of the display panel 300.

The first ultrasonic sensor 510 may be an ultrasonic fingerprint recognition sensor for recognizing a user's fingerprint. The second ultrasonic sensor 520 may be an ultrasonic proximity sensor for determining whether a user or an object is in proximity. However, the first ultrasonic sensor 510 and the second ultrasonic sensor 520 are not limited to the ultrasonic fingerprint recognition sensor and the ultrasonic proximity sensor and can serve as sensors performing other functions while emitting ultrasonic waves and sensing ultrasonic waves reflected by a user or an object.

The bracket 600 may be located under the display panel 300. The bracket 600 may include plastic, metal, or both plastic and metal. The bracket 600 may include the first camera hole CMH1 into which a camera device 720 is inserted, the battery hole BH in which a battery 790 is located, and a cable hole CAH through which a cable 314 connected to the display circuit board 310 passes.

The main circuit board 700 and the battery 790 may be located under the bracket 600. The main circuit board 700 may be a printed circuit board or a flexible printed circuit board.

The main circuit board 700 may include a main processor 710, the camera device 720, and a main connector 730. The camera device 720 may be located on both upper and lower surfaces of the main circuit board 700, the main processor 710 may be located on the upper surface of the main circuit board 700, and the main connector 730 may be located on the lower surface of the main circuit board 700.

The main processor 710 may control all the functions of the display device 10. For example, the main processor 710 may output digital video data to the display driver circuit 320 through the display circuit board 310 so that the display panel 300 can display an image. In addition, the main processor 710 may receive touch data from the touch driver circuit 330, determine a user's touch coordinates, and then execute an application indicated by an icon displayed at the user's touch coordinates.

The camera device 720 processes an image frame such as a still image or a moving image obtained by an image sensor in a camera mode and outputs the processed image frame to the main processor 710.

The cable 314 passing through the cable hole CAH of the bracket 600 may be connected to the main connector 730. Therefore, the main circuit board 700 may be electrically connected to the display circuit board 310.

The battery 790 may be arranged such that it does not overlap the main circuit board 700 in a third direction (Z-axis direction). The battery 790 may be overlapped by the battery hole BH of the bracket 600.

In addition, the main circuit board 700 may further include a mobile communication module capable of transmitting or receiving a wireless signal to or from at least one of a base station, an external terminal, or a server over a mobile communication network. The wireless signal may include a voice signal, a video call signal, or various types of data according to transmission/reception of text/multimedia messages.

The bottom cover 900 may be located under the main circuit board 700 and the battery 790. The bottom cover 900 may be fastened and fixed to the bracket 600. The bottom cover 900 may form the bottom exterior of the display device 10. The bottom cover 900 may include plastic, metal, or both plastic and metal.

A second camera hole CMH2 exposing a lower surface of the camera device 720 may be formed in the bottom cover 900. The position of the camera device 720 and the positions of the first and second camera holes CMH1 and CMH2 corresponding to the camera device 720 are not limited to the embodiment illustrated in FIG. 2.

According to some example embodiments, as illustrated in FIGS. 1 and 2, the first ultrasonic sensor 510 and the second ultrasonic sensor 520 located on the lower surface of the display panel 300 may be utilized as a fingerprint recognition sensor and a proximity sensor. Therefore, holes that expose a fingerprint recognition sensor and a proximity sensor located on a front surface of the display panel 300 can be removed. This may minimize or reduce a size or footprint of a bezel of the display device 10, thereby enabling a relatively wider display area of the display device 10.

Figure 3:
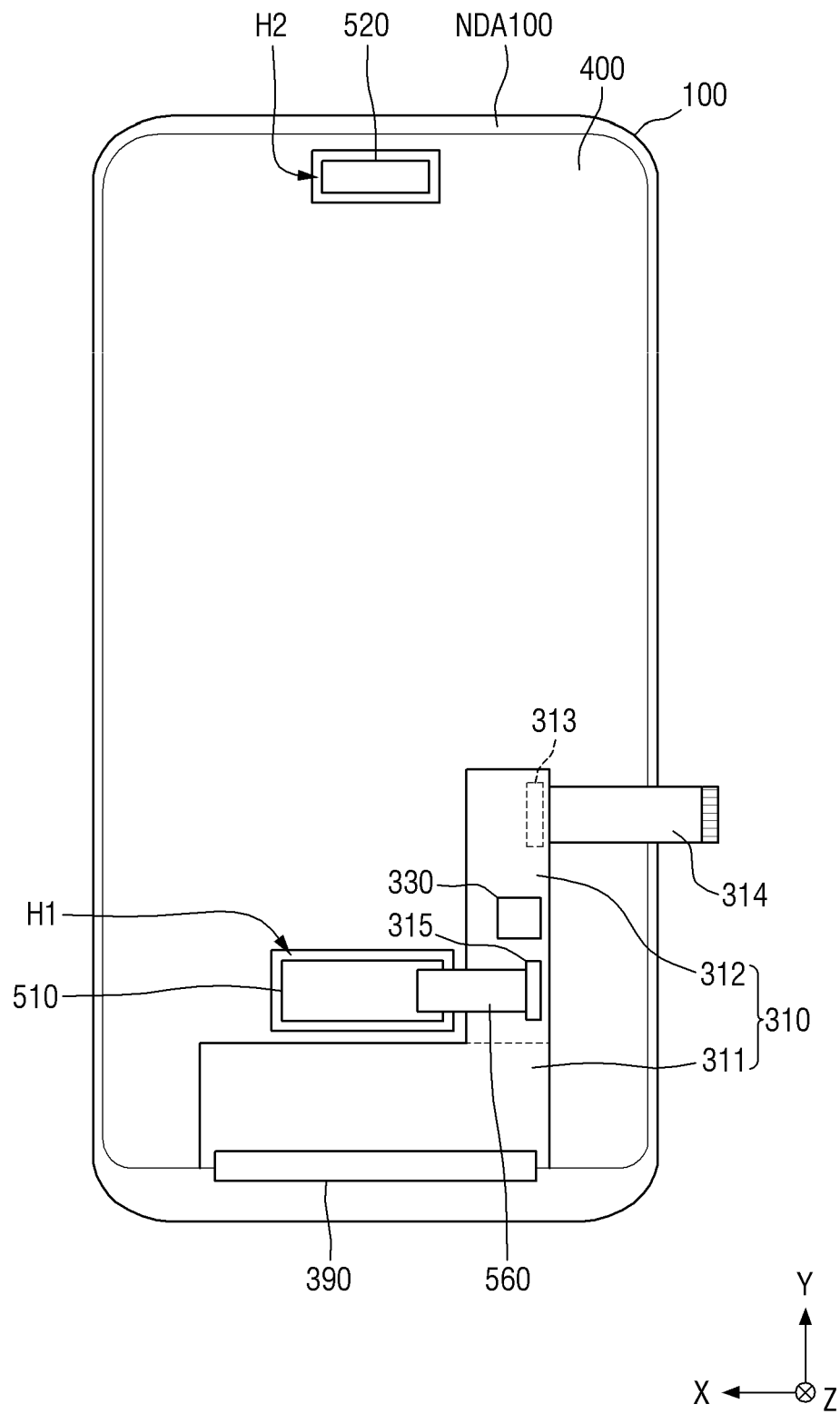
FIG. 3 is a bottom view of an example of a display panel coupled to a cover window of FIG. 2.

FIG. 3 is a bottom view of an example of the display panel 300 coupled to the cover window 100 of FIG. 2.

Referring to FIG. 3, an bottom panel cover 400 may be located under the display panel 300. The display panel 300 may be covered by the bottom panel cover 400 in the bottom view. The bottom panel cover 400 may be attached to the lower surface of the display panel 300, for example, by an adhesive member or adhesive material. The adhesive member may be a PSA.

The under-panel member 400 may include at least one of a light absorbing member for absorbing light incident from the outside, a buffer member for absorbing external impact, or a heat dissipating member for efficiently dissipating the heat of the display panel 300.

The light absorbing member may be located under the display panel 300. The light absorbing member blocks transmission of light to prevent or reduce the visibility of elements located under the light absorbing member, for example, the display circuit board 310, the first ultrasonic sensor 510, the second ultrasonic sensor 520, etc., from above the display panel 300. The light absorbing member may include a light absorbing material such as a black pigment or dye.

The buffer member may be located under the light absorbing member. The buffer member absorbs external impact to prevent or reduce damage to the display panel 300. The buffer member may be formed of a single layer or a plurality of layers. For example, the buffer member may be made of polymer resin such as polyurethane, polycarbonate, polypropylene or polyethylene or may be made of an elastic material such as sponge formed by foaming rubber, a urethane-based material or an acrylic-based material. The buffer member may operate as a cushion layer.

The heat dissipating member may be located under the buffer member. The heat dissipating member may include a first heat dissipating layer containing graphite or carbon nanotubes and a second heat dissipating layer formed of a metal thin film (such as copper, nickel, ferrite or silver) capable of shielding electromagnetic waves and having excellent thermal conductivity.

The bottom panel cover 400 may be omitted according to some example embodiments, in which case an element located on a lower surface of the bottom panel cover 400, for example, the display circuit board 310 may be located on the lower surface of the display panel 300 instead of the lower surface of the bottom panel cover 400.

The flexible film 390 attached to a side of the display panel 300 may be bent and located under the under-panel member 400 as illustrated in FIG. 3. Therefore, the display circuit board 310 attached to a side of the flexible film 390 may be located under the under-panel member 400. The display circuit board 310 located under the bottom panel cover 400 may be fixed or bonded to the lower surface of the bottom panel cover 400 by fixing members such as screws.

The display circuit board 310 may include a first circuit board 311 and a second circuit board 312. Each of the first circuit board 311 and the second circuit board 312 may be a rigid printed circuit board or a flexible printed circuit board. If any one of the first circuit board 311 and the second circuit board 312 is a rigid printed circuit board and the other is a flexible printed circuit board, the display circuit board 310 may be a composite printed circuit board.

In FIG. 3, the second circuit board 312 extends from a side of the first circuit board 311 in the second direction (Y-axis direction). A width of the second circuit board 312 in the first direction (X-axis direction) may be smaller than a width of the first circuit board 311 in the first direction (X-axis direction).

The touch driver circuit 330 and a second connector 315 may be located on a surface of the second circuit board 312, and a first connector 313 may be located on the other surface of the second circuit board 312. The first connector 313 may include an insertion portion connected to a first connection terminal provided at an end of the cable 314. The second connector 315 may include an insertion portion connected to a connection terminal provided at an end of a first flexible circuit board 560.

The first connection terminal provided at the end of the cable 314 may be inserted into the insertion portion of the first connector 313. A second connection terminal provided at the other end of the cable 314 may be bent to under the main circuit board 700 through the cable hole CAH penetrating the bracket 600 and then may be inserted into an insertion portion of the main connector 730 as illustrated in FIGS. 2 and 3.

The first ultrasonic sensor 510 may be located in a first hole H1 penetrating the under-panel member 400 and exposing the display panel 300. The first ultrasonic sensor 510 may be attached to the lower surface of the display panel 300 using an adhesive member such as a PSA.

The second ultrasonic sensor 520 may be located in a second hole H2 penetrating the under-panel member 400 and exposing the display panel 300. The second ultrasonic sensor 520 may be attached to the lower surface of the display panel 300 using an adhesive member such as a PSA.

The connection terminal provided at the end of the first flexible circuit board 560 may be inserted into the insertion portion of the second connector 315. The other end of the first flexible circuit board 560 may be connected to the first ultrasonic sensor 510. For example, the other end of the first flexible circuit board 560 may be attached to pads located on a lower surface of the first ultrasonic sensor 510 using an anisotropic conductive film.

A second flexible circuit board electrically connecting the display circuit board 310 and the second ultrasonic sensor 520 may be additionally provided. A connection terminal provided at an end of the second flexible circuit board may be inserted into an insertion portion of a connector of the display circuit board 310, and the other end of the second flexible circuit board may be attached to pads located on a lower surface of the second ultrasonic sensor 520 using an anisotropic conductive film.

The bracket 600 may include the battery hole BH, the cable hole CAH, and the first camera hole CMH1. Because the battery hole BH is a hole for accommodating the battery 790, the battery 790 may overlap the battery hole BH in the third direction (Z-axis direction) as illustrated in FIG. 2. The battery hole BH may be larger in size than the battery 790. In addition, because the first camera hole CMH1 of the bracket 600 is a hole for accommodating the camera device 720 of the main circuit board 700, the camera device 720 may overlap the first camera hole CMH1 in the third direction (Z-axis direction).

According to some example embodiments, as illustrated in FIG. 3, the first ultrasonic sensor 510 and the second ultrasonic sensor 520 may be located on the lower surface of the display panel 300 and may be electrically connected to the display circuit board 310 by the first flexible circuit board 560 and the second flexible circuit board. The main circuit board 700 and the display circuit board 310 may be electrically connected by the cable 314. Therefore, the first ultrasonic sensor 510 and the second ultrasonic sensor 520 may be electrically connected to the main circuit board 700.

Figure 4:
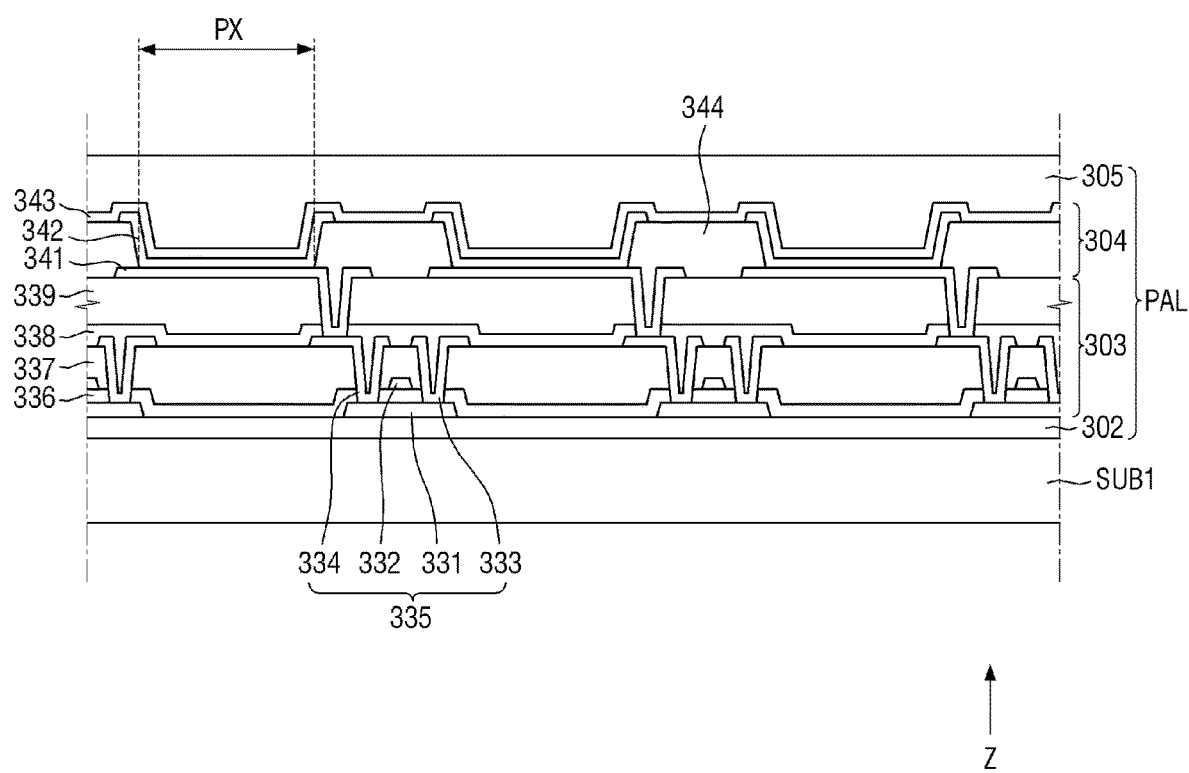
FIG. 4 is a cross-sectional view of an example of a display area of the display panel illustrated in FIG. 2.

FIG. 4 is a cross-sectional view of an example of a display area of the display panel 300 illustrated in FIG. 2.

Referring to FIG. 4, the display panel 300 may include the substrate SUB1 and a pixel array layer PAL. The pixel array layer PAL may include the buffer layer 302, a thin-film transistor layer 303, a light emitting element layer 304, and a thin-film encapsulation layer 305 as illustrated in FIG. 4.

The substrate SUB1 may be made of plastic or glass. The buffer layer 302 may be formed on the substrate SUB1. The buffer layer 302 may be formed on the substrate SUB1 to protect thin-film transistors 335 and light emitting elements from moisture introduced through the substrate SUB1 which may otherwise be vulnerable to moisture penetration. The buffer layer 302 may be formed of a plurality of inorganic layers stacked alternately. For example, the buffer layer 302 may be a multilayer in which one or more inorganic layers selected from a silicon oxide (SiOx) layer, a silicon nitride (SiNx) layer, and SiON are alternately stacked. The buffer layer 302 can be omitted.

The thin-film transistor layer 303 is formed on the buffer layer 302. The thin-film transistor layer 303 includes the thin-film transistors 335, a gate insulating layer 336, an interlayer insulating film 337, a protective layer 338, and a planarization layer 339.

Each of the thin-film transistors 335 includes an active layer 331, a gate electrode 332, a source electrode 333, and a drain electrode 334. In FIG. 4, each of the thin-film transistors 335 is formed as a top-gate type in which the gate electrode 332 is located above the active layer 331. However, it should be noted that embodiments are not limited thereto. That is, each of the thin-film transistors 335 may also be formed as a bottom-gate type in which the gate electrode 332 is located under the active layer 331 or a double-gate type in which the gate electrode 332 is located both above and under the active layer 331.

The active layers 331 are formed on the buffer layer 302. The active layers 331 may be made of a silicon-based semiconductor material or an oxide-based semiconductor material. A light shielding layer may be formed between the buffer layer 302 and the active layers 331 to block external light from entering the active layers 331.

The gate insulating layer 336 may be formed on the active layers 331. The gate insulating layer 336 may be an inorganic layer, for example, a SiOx layer, a SiNx layer, or a multilayer composed of these layers.

The gate electrodes 332 and gate lines may be formed on the gate insulating layer 336. Each of the gate electrodes 332 and the gate lines may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The interlayer insulating film 337 may be formed on the gate electrodes 332 and the gate lines. The interlayer insulating film 337 may be an inorganic layer, for example, a SiOx layer, a SiNx layer, or a multilayer composed of these layers.

The source electrodes 333, the drain electrodes 334, and data lines may be formed on the interlayer insulating film 337. Each of the source electrodes 333 and the drain electrodes 334 may be connected to an active layer 331 through a contact hole passing through the gate insulating layer 336 and the interlayer insulating film 337. Each of the source electrodes 333, the drain electrodes 334 and the data lines may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The protective layer 338 for insulating the thin-film transistors 335 may be formed on the source electrodes 333, the drain electrodes 334, and the data lines. The protective layer 338 may be an inorganic layer, for example, a SiOx layer, a SiNx layer, or a multilayer composed of these layers.

The planarization layer 339 may be formed on the protective layer 338 to planarize steps or non-planar textures due to the thin-film transistors 335. The planarization layer 339 may be made of an organic layer such as acryl resin, epoxy resin, phenolic resin, polyamide resin, or polyimide resin.

The light emitting element layer 304 is formed on the thin-film transistor layer 303. The light emitting element layer 304 includes the light emitting elements and a pixel defining layer 344.

The light emitting elements and the pixel defining layer 344 are formed on the planarization layer 339. The light emitting elements may be organic light emitting devices, each including an anode 341, a light emitting layer 342, and a cathode 343.

The anodes 341 may be formed on the planarization layer 339. The anodes 341 may be connected to the source electrodes 333 or the drain electrodes 334 of the thin-film transistors 335 through contact holes passing through the protective layer 338 and the planarization layer 339.

The pixel defining layer 344 may be formed on the planarization layer 339 and may cover edges of the anodes 341 to define pixels PX. That is, the pixel defining layer 344 serves as a pixel defining layer for defining the pixels PX. Each of the pixels PX is an area in which the anode 341, the light emitting layer 342 and the cathode 343 are sequentially stacked so that holes from the anode 341 and electrons from the cathode 343 combine together in the light emitting layer 342 to emit light.

The light emitting layers 342 are formed on the anodes 341 and the pixel defining layer 344. The light emitting layers 342 may be organic light emitting layers. Each of the light emitting layers 342 may emit one of red light, green light, and blue light. Alternatively, the light emitting layers 342 may be white light emitting layers which emit white light. In this case, the light emitting layers 342 may be a stack of a red light emitting layer, a green light emitting layer and a blue light emitting layer and may be a common layer common to all of the pixels PX. In this case, the display panel 300 may further include color filters for displaying red, green and blue.

Each of the light emitting layers 342 may include a hole transporting layer, a light emitting layer, and an electron transporting layer. In addition, each of the light emitting layers 342 may be formed in a tandem structure of two or more stacks, in which case a charge generating layer may be formed between the stacks.

The cathode 343 is formed on the light emitting layers 342. The cathode 343 may be formed to cover the light emitting layers 342. The cathode 343 may be a common layer common to all of the pixels PX.

Although a case where the light emitting element layer 304 is formed as a top emission layer which emits light in an upward direction has been mainly described, embodiments are not limited thereto. The light emitting element layer 304 may also be formed as a bottom emission layer which emits light in a downward direction. When the light emitting element layer 304 is formed as the top emission later, the anodes 341 may be made of a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu). In addition, the cathode 343 may be made of a transparent conductive material (TCO) capable of transmitting light, such as indium tin oxide (ITO) or indium zinc oxide (IZO), or a semi-transmissive conductive material such as magnesium (Mg), silver (Ag) or an alloy of Mg and Ag. When the cathode 343 is made of a semi-transmissive conductive material, the light output efficiency may be increased by a microcavity.

The thin-film encapsulation layer 305 is formed on the light emitting element layer 304. The thin-film encapsulation layer 305 serves to prevent or reduce oxygen, moisture, or other external contaminants penetrating into the light emitting layers 342 and the cathode 343. To this end, the thin-film encapsulation layer 305 may include at least one inorganic layer. The inorganic layer may be made of silicon nitride, aluminum nitride, zirconium nitride, titanium nitride, hafnium nitride, tantalum nitride, silicon oxide, aluminum oxide, or titanium oxide. In addition, the thin-film encapsulation layer 305 may further include at least one organic layer. The organic layer may be formed to a sufficient thickness so as to prevent or reduce instances of particles or contaminants penetrating the thin-film encapsulation layer 305 and entering the light emitting layers 342 and the cathode 343. The organic layer may include any one of epoxy, acrylate, and urethane acrylate.

The touch sensor layer may be formed on the thin-film encapsulation layer 305. When the touch sensor layer is arranged directly on the thin-film encapsulation layer 305, a thickness of the display device 10 can be reduced as compared with when a separate touch panel is attached onto the thin-film encapsulation layer 305. The touch sensor layer may include touch electrodes for sensing a user's touch using a capacitance method and touch lines for connecting pads and the touch electrodes. For example, the touch sensor layer may sense a user's touch using a self-capacitance method or a mutual capacitance method.

Figure 5:
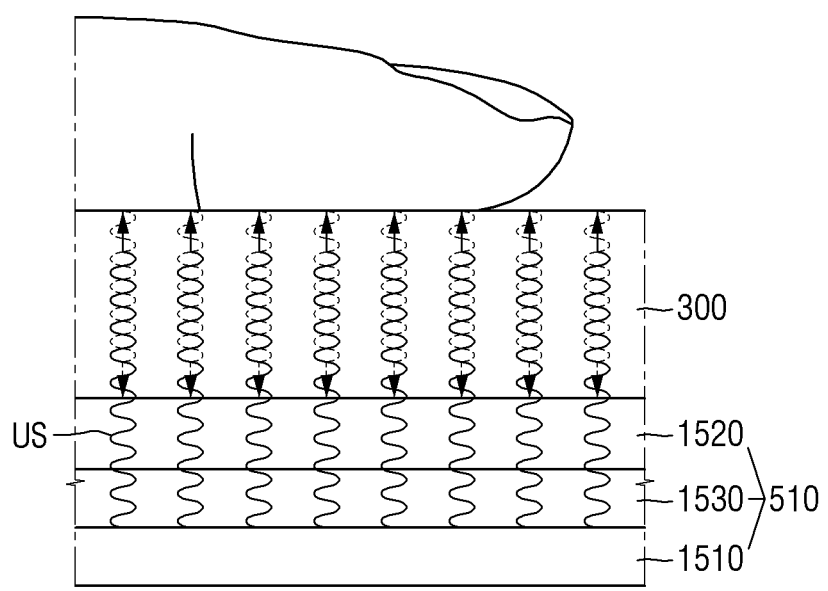
FIG. 5 illustrates an ultrasonic sensing method of a first ultrasonic sensor according to some example embodiments.

FIG. 5 illustrates an ultrasonic sensing method of the first ultrasonic sensor 510 according to some example embodiments.

Referring to FIG. 5, the first ultrasonic sensor 510 is located on a surface of the display panel 300. The first ultrasonic sensor 510 may be attached onto the surface of the display panel 300 by an adhesive member such as a PSA.

The first ultrasonic sensor 510 includes the ultrasonic emitting device 1510, the ultrasonic sensing device 1520, and a spacer 1530.

The ultrasonic sensing device 1520 may be located on the surface of the display panel 300, and the ultrasonic emitting device 1510 may be located on a surface of the ultrasonic sensing device 1520. The surface of the display panel 300 may be a surface opposite the other surface of the display panel 300 on which a user's finger F is placed for fingerprint recognition. The surface of the ultrasonic sensing device 1520 may be a surface opposite the other surface of the ultrasonic sensing device 1520 which faces the display panel 300.

The spacer 1530 may be located between the ultrasonic emitting device 1510 and the ultrasonic sensing device 1520. The spacer 1530 may be made of glass.

The ultrasonic emitting device 1510 is located under the ultrasonic sensing device 1520. The ultrasonic emitting device 1510 may include a sensing layer. The sensing layer of the ultrasonic emitting device 1510 may be a piezoelectric layer such as polyvinylidene fluoride (PVDF) or plumbum zirconate titanate (PZT). When driving voltages are applied to driving electrodes of the piezoelectric layer, the ultrasonic emitting device 1510 may output ultrasonic waves US by vibrating the piezoelectric layer through an inverse piezoelectric effect. For example, the ultrasonic emitting device 1510 may output ultrasonic waves of 20 kHz or more which are difficult for humans to recognize or perceive.

The ultrasonic emitting device 1510 may output the ultrasonic waves US toward the display panel 300. The ultrasonic emitting device 1510 may output the ultrasonic waves US through a surface facing the ultrasonic sensing device 1520. The ultrasonic waves US output through the other surface opposite the surface of the ultrasonic emitting device 1510 may be reflected by an object and input as noise. Therefore, an ultrasonic shielding film may be located on the other surface of the ultrasonic emitting device 1510 to minimize the ultrasonic waves US output through the other surface of the ultrasonic emitting device 1510.

The ultrasonic sensing device 1520 may output sensing voltages according to ultrasonic waves US reflected by the finger F among the ultrasonic waves US output from the ultrasonic emitting device 1510. The ultrasonic sensing device 1520 may include a sensing layer. The sensing layer of the ultrasonic sensing device 1520 may be piezoelectric layer such as polyvinylidene fluoride (PVDF) or plumbum zirconate titanate (PZT). When a driving voltage is applied to a driving electrode of the piezoelectric layer, the ultrasonic sensing device 1520 may generate voltages in sensing electrodes through a piezoelectric effect of the piezoelectric layer due to the ultrasonic waves US. The ultrasonic sensing device 1520 may output sensing voltages according to the voltages of the sensing electrodes.

The ultrasonic sensing device 1520 may output the sensing voltages to a fingerprint recognition unit. There are time differences between ultrasonic waves US reflected by ridges of a fingerprint of the finger F and ultrasonic waves US reflected by valleys of the fingerprint of the finger F. The fingerprint recognition unit may generate a fingerprint pattern by using the sensing voltages reflecting these time differences. The fingerprint recognition unit may determine whether the generated fingerprint pattern matches a pre-stored fingerprint pattern.

Figure 6:
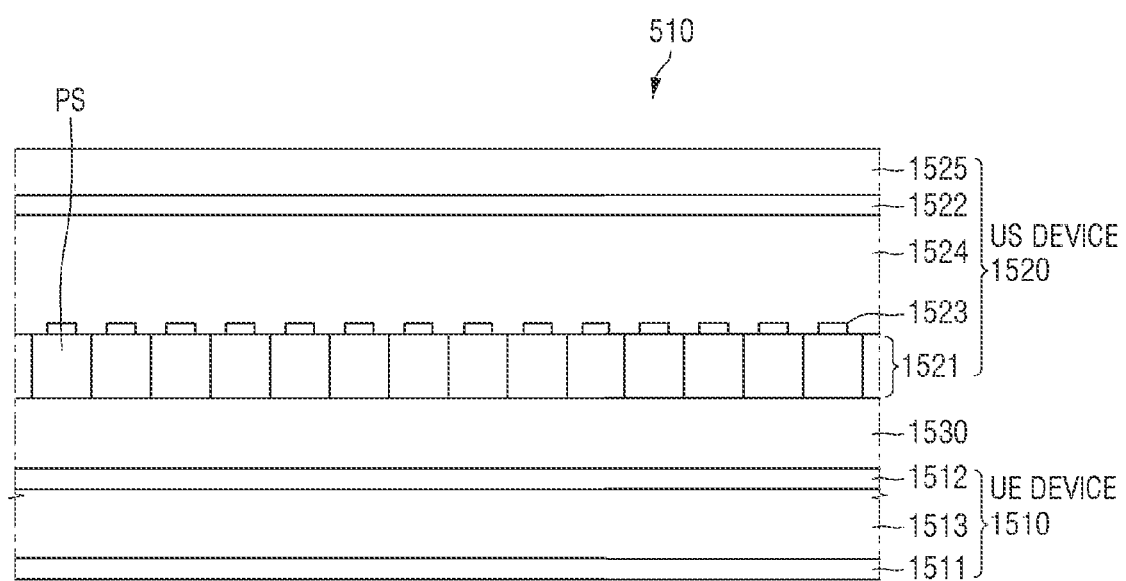
FIG. 6 is a detailed cross-sectional view of the first ultrasonic sensor of FIG. 5.

FIG. 6 is a cross-sectional view of the first ultrasonic sensor 510 of FIG. 2.

Referring to FIG. 6, the ultrasonic emitting device 1510 may include a first driving electrode 1511, a second driving electrode 1512, and a first piezoelectric layer 1513. The first piezoelectric layer 1513 may be referred as a first sensing layer.

The first driving electrode 1511 may be located on a first surface of the first piezoelectric layer 1513, and the second driving electrode 1512 may be located on a second surface opposite the first surface of the first piezoelectric layer 1513. The second surface of the first piezoelectric layer 1513 may be a surface facing the ultrasonic sensing device 1520. The first driving electrode 1511 may be located on the entire first surface of the first piezoelectric layer 1513, and the second driving electrode 1512 may be arranged on the entire second surface of the first piezoelectric layer 1513. The first piezoelectric layer 1513 may be located between the first driving electrode 1511 and the second driving electrode 1512.

Each of the first driving electrode 1511 and the second driving electrode 1512 may be made of an opaque metal material or a transparent conductive oxide. The first piezoelectric layer 1513 may be made of polyvinylidene fluoride (PVDF) or plumbum zirconate titanate (PZT). When alternating current (AC) voltages are applied to the first driving electrode 1511 and the second driving electrode 1512, the first piezoelectric layer 1513 may vibrate to output ultrasonic waves of 20 kHz or more which are difficult for humans to recognize.

The ultrasonic sensing device 1520 may include a pixel sensor array 1521 including pixel sensors PS, a sensing driving electrode 1522, sensing electrodes 1523, a second piezoelectric layer 1524, and a protective layer 1525. The second piezoelectric layer 1524 may be referred as a second piezoelectric layer.

The pixel sensors PS are located on the spacer 1530, and the sensing electrodes 1523 are located on the pixel sensors PS. The pixel sensors PS may be connected one-to-one to the sensing electrodes 1523. The pixel sensors PS may output sensing voltages to sensing lines according to voltages of the sensing electrodes 1523, respectively. The fingerprint recognition unit may generate a fingerprint pattern by analyzing the sensing voltages of the sensing lines. The fingerprint recognition unit may determine whether the generated fingerprint pattern matches a pre-stored fingerprint pattern.

The second piezoelectric layer 1524 may be located on the sensing electrodes 1523, and the sensing driving electrode 1522 may be located on the second piezoelectric layer 1524. The second piezoelectric layer 1524 may be located between the sensing driving electrode 1522 and the sensing electrodes 1523. The sensing driving electrode 1522 may be located on the whole of a surface of the second piezoelectric layer 1524. When a driving voltage is applied to the sensing driving electrode 1522, if ultrasonic waves reflected by a finger F among the ultrasonic waves emitted from the ultrasonic emitting device 1510 are incident on the second piezoelectric layer 1524, the ultrasonic sensing device 1520 may generate voltages in the sensing electrodes 1523 through the piezoelectric effect of the second piezoelectric layer 1524.

Although the second piezoelectric layer 1524 is integrally formed on the pixel sensors PS in FIG. 6, embodiments are not limited to this case. The second piezoelectric layer 1524 may be divided to correspond one-to-one to the pixel sensors PS.

The protective layer 1525 may be located on the sensing driving electrode 1522 to protect the second piezoelectric layer 1524 and the sensing driving electrode 1522. The protective layer 1525 may include an insulating material. The protective layer 1525 may include a material having elasticity to provide a buffering effect.

The spacer 1530 may be located between the second driving electrode 1512 of the ultrasonic emitting device 1510 and the pixel sensor array 1521 of the ultrasonic sensing device 1520.

According to some example embodiments, as illustrated in FIG. 6, the first ultrasonic sensor 510 may emit ultrasonic waves through the ultrasonic emitting device 1510 and output sensing voltages according to ultrasonic waves reflected by a finger through the ultrasonic sensing device 1520. Therefore, the fingerprint recognition unit may generate a fingerprint pattern by analyzing the sensing voltages of the sensing lines and determine whether the generated fingerprint pattern matches a pre-stored fingerprint pattern. The fingerprint recognition unit may generate a fingerprint signal according to whether the fingerprint patterns match and output the generated fingerprint signal to the main processor 710.

The second ultrasonic sensor 520 may be implemented substantially the same as the first ultrasonic sensor 510 illustrated in FIGS. 5 and 6. However, because the second ultrasonic sensor 520 is implemented as a proximity sensor, it may include a proximity recognition unit which determines whether or not a user or an object is in proximity by analyzing the sensing voltages of the sensing lines, instead of the fingerprint recognition unit. The proximity recognition unit may generate a proximity signal according to whether or not a user or an object is in proximity and output the proximity signal to the main processor 710.

Figure 7:
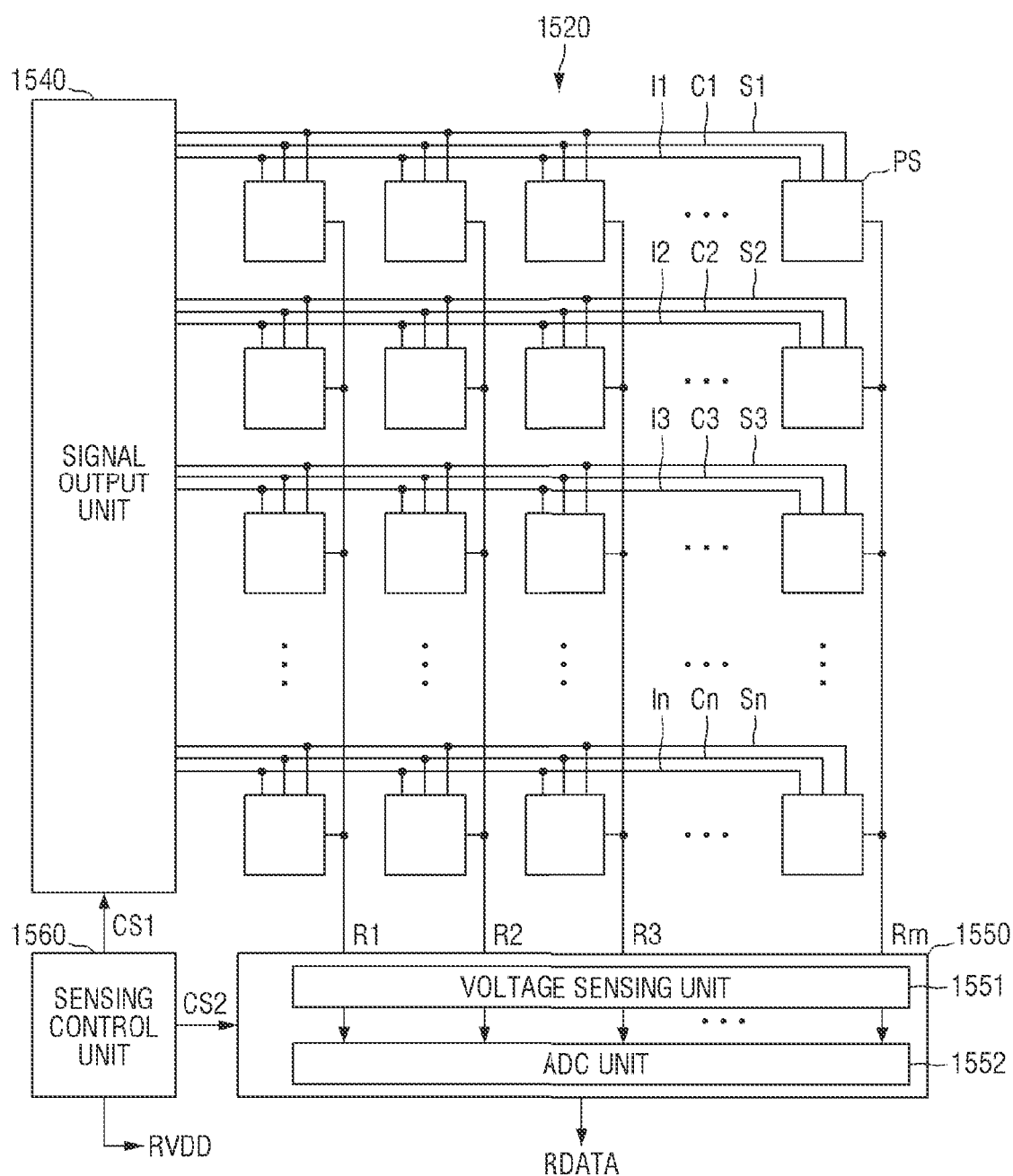
FIG. 7 is a schematic block diagram of an ultrasonic sensing device.

FIG. 7 is a schematic block diagram of the ultrasonic sensing device 1520.

Referring to FIG. 7, the ultrasonic sensing device 1520 may include the pixel sensors PS, a signal output unit 1540, a sensing unit 1550, and a sensing control unit 1560.

The pixel sensors PS may be arranged in the first direction (horizontal direction) and the second direction (vertical direction) intersecting the first direction. The pixel sensors PS may be arranged in two dimensions.

Selection signal lines S1 through Sn, initialization signal lines I1 through In and control voltage lines C1 through Cn may extend in the first direction, and sensing lines R1 through Rm may extend in the second direction. Because the pixel sensors PS are arranged in two dimensions, each of the pixel sensors PS may be connected to any one of the selection signal lines S1 through Sn (where n is a positive integer of 2 or greater), any one of the initialization signal lines I1 through In, any one of the control voltages lines C1 through Cn, and any one of the sensing lines R1 through Rm according to two-dimensional coordinates. For example, a pixel sensor PS located in a second row and a third column may be connected to the second selection signal line S2, the second initialization line I2, the second control voltage line C2, and the third sensing line R3.

The signal output unit 1540 may be connected to the selection signal lines S1 through Sn, the initialization signal lines I1 through In, and the control voltage lines C1 through Cn. The signal output unit 1540 may generate selection signals to be output to the selection signal lines S1 through Sn, generate initialization signals to be output to the initialization signal lines I1 through In, and generate control signals to be output to the control lines C1 trough Cn according to a first control signal CS1 received from the sensing control unit 1560.

The sensing unit 1550 may be connected to the sensing lines R1 through Rm. The sensing unit 1550 may include a voltage sensing unit 1551 which senses sensing voltages of the sensing lines R1 through Rm and an analog-digital conversion unit 1552 which converts the sensing voltages sensed by the voltage sensing unit 1551 into sensing data RDATA which is digital data. The sensing unit 1550 may output the sensing data RDATA to the fingerprint recognition unit. The fingerprint recognition unit may generate a fingerprint pattern according to the sensing data RDATA and determine whether the generated fingerprint pattern matches a pre-stored fingerprint pattern. The fingerprint recognition unit may generate a fingerprint signal according to whether the fingerprint patterns match and output the generated fingerprint signal to the main processor 710.

The sensing control unit 1560 outputs the first control signal CS1 to the signal output unit 1540 and outputs a sensing driving voltage RVDD to the sensing driving electrode 1522. The sensing control unit 1560 may output a second control signal CS2 for controlling the sensing unit 1550 to the sensing unit 1550. The sensing unit 1550 may sense sensing voltages of pixel sensors PS selected by selection signals according to the second control signal CS2.

Figure 8:
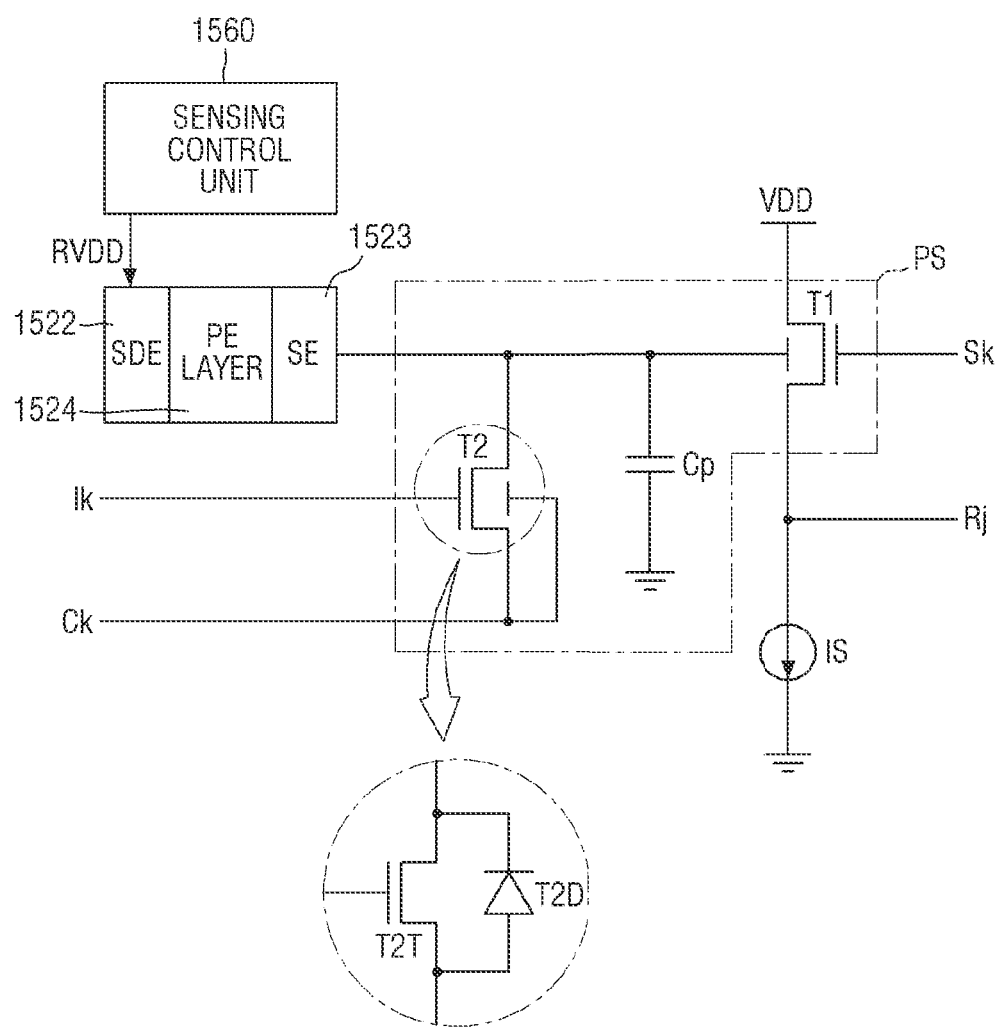
FIG. 8 is a circuit diagram of an example of a pixel sensor of the ultrasonic sensing device illustrated in FIG. 7.

FIG. 8 is a circuit diagram of an example of a pixel sensor PS of the ultrasonic sensing device 1520 illustrated in FIG. 7.

In FIG. 8, a pixel sensor PS connected to a $k^{th}$ (where k is an integer satisfying $1 \leq k \leq n$) selection line Sk, a $k^{th}$ initialization line Ik, a $k^{th}$ control voltage line Ck, and a $j^{th}$ (where j is an integer satisfying $1 \leq r \leq m$) sensing line Rj is illustrated.

Referring to FIG. 8, the pixel sensor PS may include a first transistor T1, a second transistor T2, and a capacitor Cp.

Figure 14:
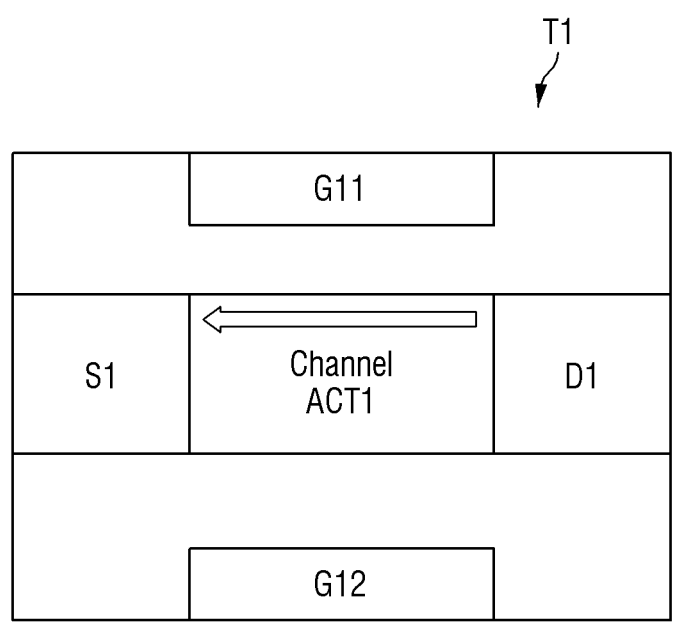
FIG. 14 illustrates an example of a first transistor of FIG. 8.

The first transistor T1 is turned on by a $k^{th}$ selection signal of the $k^{th}$ selection line Sk and outputs a sensing voltage to the $j^{th}$ sensing line Rj according to a voltage of a sensing electrode 1523. With reference to FIGS. 8 and 14, the first transistor T1 may include a first gate electrode G11 connected to the $k^{th}$ selection line Sk, a second gate electrode G12 connected to the sensing electrode 1523, a first electrode S1 connected to the $j^{th}$ sensing line Rj, and a second electrode D1 connected to a first driving voltage line VDDL. The first gate electrode G11 of the first transistor T1 may be an upper gate electrode located above a first active layer ACT1 of the first transistor T1, and the second gate electrode G12 of the first transistor T1 may be a lower gate electrode located under the first active layer ACT1 of the first transistor T1.

In the first transistor T1, as illustrated in FIG. 14, only an upper channel adjacent to the first gate electrode G11 may be activated, and a lower channel adjacent to the second gate electrode G12 may not be activated. For example, when a voltage difference between the second gate electrode G12 and the first electrode S1 of the first transistor T1 is lower than a threshold voltage Vth, the lower channel adjacent to the second gate electrode G12 of the first transistor T1 may not be activated. A distance between the first gate electrode G11 and the first active layer ACT1 may be smaller than a distance between the second gate electrode G12 and the first active layer ACT1. The operation of the first transistor T1 will be described in more detail later with reference to FIG. 9.

The second transistor T2 is turned on by a $k^{th}$ initialization signal of the $k^{th}$ initialization line Ik and connects the sensing electrode 1523 to the $k^{th}$ control voltage line Ck. In addition, the second transistor T2 is turned on by the $k^{th}$ control voltage line Ck of a first voltage and connects the sensing electrode 1523 to the $k^{th}$ control voltage line Ck. The second transistor T2 may include a first gate electrode connected to the $k^{th}$ initialization line Ik, a second gate electrode and a first electrode connected to the $k^{th}$ control voltage line Ck, and a second electrode connected to the sensing electrode 1523. The first gate electrode of the second transistor T2 may be an upper gate electrode located above a second active layer of the second transistor T2, and the second gate electrode of the second transistor T2 may be a lower gate electrode located under the second active layer of the second transistor T2. The second transistor T2 may be represented by one transistor T2T and one diode T2D as illustrated in FIG. 8.

In the second transistor T2, an upper channel adjacent to the first gate electrode and a lower channel adjacent to the second gate electrode may all be activated. The upper channel of the second transistor T2 may be activated or deactivated by a voltage applied to the first gate electrode, and the lower channel of the second transistor T2 may be activated or deactivated by a voltage applied to the second gate electrode. The operation of the second transistor T2 will be described in more detail later with reference to FIG. 9.

The capacitor Cp may be connected to the second gate electrode G12 of the first transistor T1 and a second driving voltage source or a second driving voltage line to which a second driving voltage is applied. A first electrode of the capacitor Cp may be connected to the second gate electrode G12 of the first transistor T1, and the second driving voltage may be applied to a second electrode of the capacitor Cp.

When the first electrode of each of the first transistor T1 and the second transistor T2 is a source electrode, the second electrode may be a drain electrode. Alternatively, when the first electrode of each of the first transistor T1 and the second transistor T2 is a drain electrode, the second electrode may be a source electrode.

Each of the first transistor T1 and the second transistor T2 may be a field effect transistor. Although each of the first transistor T1 and the second transistor T2 is an N-type metal oxide semiconductor field effect transistor (MOSFET) in FIG. 8, embodiments are not limited to this case. That is, each of the first transistor T1 and the second transistor T2 may also be formed as a P-type MOSFET. When each of the first transistor T1 and the second transistor T2 is formed as a P-type MOSFET, the timing of FIG. 9 should be modified to suit characteristics of the P-type MOSET.

Each of the first transistor T1 and the second transistor T2 may be formed as a thin-film transistor. In this case, each of the first active layer ACT1 of the first transistor T1 and the second active layer of the second transistor may be made of any one of polysilicon, amorphous silicon, and oxide. When each of the first active layer ACT1 of the first transistor T1 and the second active layer of the second transistor T2 is made of polysilicon, a process for forming the first active layer ACT1 and the second active layer may be a low-temperature polysilicon (LTPS) process.

Figure 9:
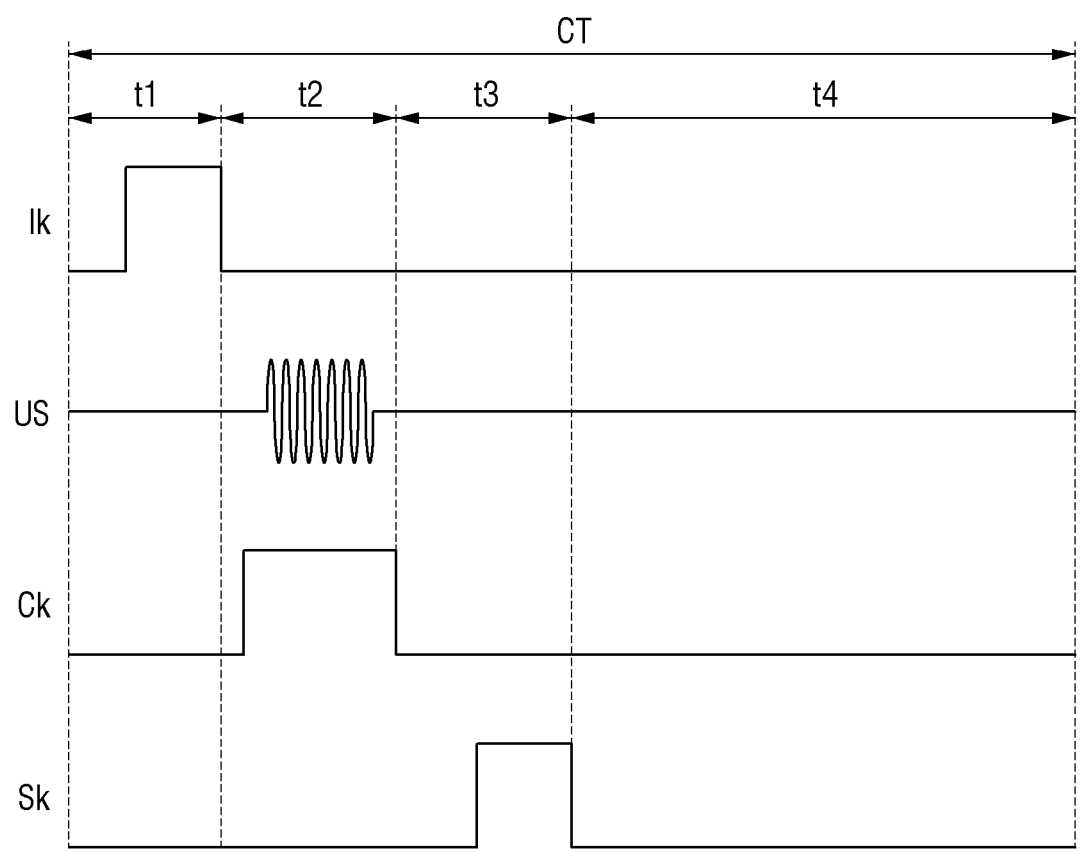
FIG. 9 illustrates waveforms of signals transmitted from the pixel sensor of FIG. 8.

FIG. 9 illustrates waveforms of signals transmitted from the pixel sensor PS of FIG. 8.

Referring to FIG. 9, a $k^{th}$ initialization signal ISk transmitted to the $k^{th}$ initialization line Ik is a signal transmitted to the first gate electrode of the second transistor T2 and a signal for activating the upper channel of the second transistor T2. A $k^{th}$ selection signal SSk transmitted to the $k^{th}$ selection line Sk is a signal transmitted to the first gate electrode G11 of the first transistor T1 and a signal for activating the upper channel of the first transistor T1. A kth control voltage CVk applied to the kth control voltage line Ck is a voltage applied to the first gate electrode of the second transistor T2 and a voltage for activating the lower channel of the second transistor T2.

The kth initialization signal ISk, the kth selection signal SSk, and the kth control voltage CVk may be repeated according to cycles (e.g., set or predetermined cycles) CT. One cycle CT may include first through fourth periods t1 through t4. The first period t1 is a reset period of the sensing electrode 1523, the second period t2 is a period during which a voltage of the sensing electrode 1523 is stored in the capacitor Cp due to ultrasonic waves US reflected by a finger, the third period t3 is a period during which a sensing voltage is output to the jth sensing line Rj according to a voltage of the second gate electrode G12 of the first transistor T1 stored in the capacitor Cp, and the fourth period t4 is a rest period.

The $k^{th}$ initialization signal ISk is output as a gate-on voltage Von during the first period t1 and output as a gate-off voltage Voff during the second through fourth periods t2 through t4. The $k^{th}$ selection signal SSk is output as the gate-on voltage Von during the third period t3 and output as the gate-off voltage Voff during the first, second and fourth periods t1, t2 and t4. The kth control voltage CVk is output as a bias voltage BV during the second period t2 and output as the gate-off voltage Voff during the first, third and fourth periods t1, t3 and t4. The gate-on voltage Von refers to a voltage that stably activates the upper channel of the first transistor T1 and the upper channel and the lower channel of the second transistor T2. The gate-off voltage Voff refers to a voltage that stably deactivates the upper channel of the first active layer ACT1 of the first transistor T1 and the upper channel and the lower channel of the second transistor T2. The bias voltage BV is a voltage for activating the lower channel of the second transistor T2 according to the voltage of the sensing electrode 1523 and may be set as a voltage between the gate-on voltage Von and the gate-off voltage Voff.

FIGS. 10 through 13 are circuit diagrams of the pixel sensor PS during the first through fourth periods t1 through t4. The operation of the pixel sensor PS during the first through fourth periods t1 through t4 of one cycle CT will now be described in more detail with reference to FIGS. 9 through 13.

Figure 10:
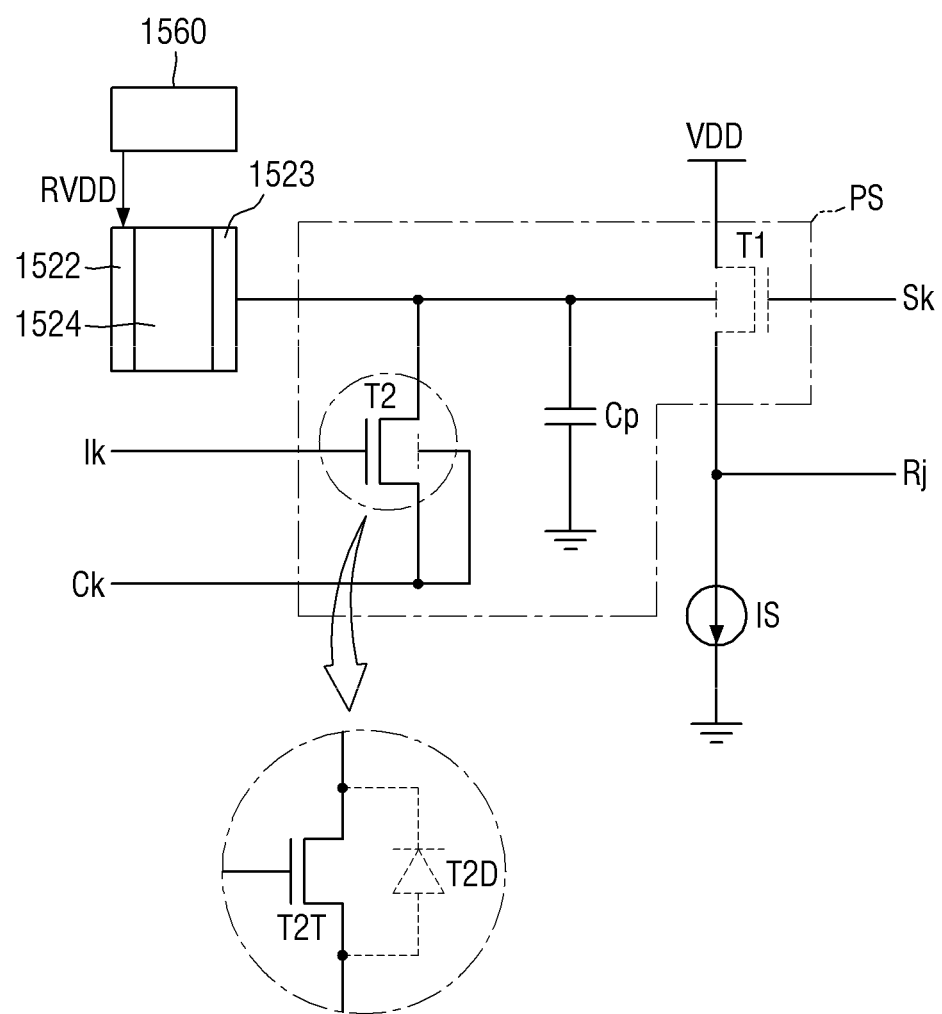
FIGS. 10 through 13 are circuit diagrams of the pixel sensor during first through fourth periods.

First, referring to FIG. 10, during the first period t1, the $k^{th}$ initialization signal ISk of the gate-on voltage Von is transmitted to the $k^{th}$ initialization signal Ik, the $k^{th}$ selection signal SSk of the gate-off voltage Voff is transmitted to the $k^{th}$ selection line Sk, and the $k^{th}$ control voltage CVk of the gate-off voltage Voff is applied to the $k^{th}$ control voltage line Ck. In addition, the sensing control unit 1560 applies the sensing driving voltage RVDD to the sensing driving electrode 1522 during the first through fourth periods t1 through t4.

Because the $k^{th}$ initialization signal ISk of the gate-on voltage Von is transmitted to the first gate electrode of the second transistor T2, the upper channel of the second transistor T2 is activated. Therefore, the sensing electrode 1523 connected to the $k^{th}$ control voltage line Ck may be initialized to the gate-off voltage Voff of the $k^{th}$ control voltage line Ck.

Figure 11:
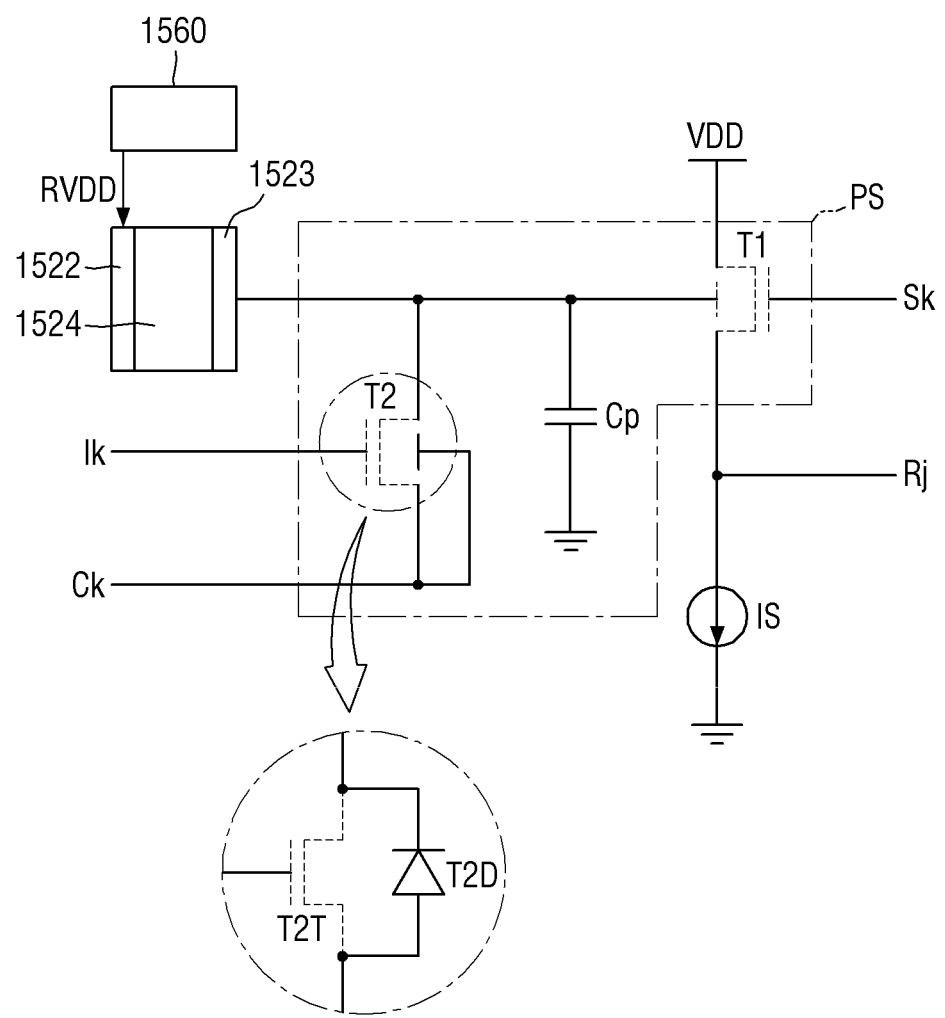

Second, referring to FIG. 11, during the second period t2, the $k^{th}$ control voltage CVk of the bias voltage BV is transmitted to the $k^{th}$ control voltage line Ck, the $k^{th}$ initialization signal ISk of the gate-off voltage Voff is transmitted to the $k^{th}$ initialization line Ik, and the $k^{th}$ selection signal SSk of the gate-off voltage Voff is transmitted to the $k^{th}$ selection line Sk. In addition, because ultrasonic waves US are emitted from the ultrasonic emitting device 1510 during the second period t2, a voltage is generated in the sensing electrode 1523 by the inverse piezoelectric effect of the second piezoelectric layer 1524 due to ultrasonic waves US reflected by a finger. Alternatively, if the ultrasonic waves US are not reflected by the finger, the sensing electrode 1523 may have the gate-off voltage Voff charged during the first period t1 because no voltage is generated in the sensing electrode 1523.

When a difference between the bias voltage BV of the $k^{th}$ control voltage CVk and the voltage of the sensing electrode 1523 is higher than a threshold voltage of the lower channel of the second transistor T2, the lower channel of the second transistor T2 may be activated. When the difference between the bias voltage BV of the $k^{th}$ control voltage CVk and the voltage of the sensing electrode 1523 is equal to or lower than the threshold voltage of the lower channel of the second transistor T2, the lower channel of the second transistor T2 may be deactivated.

When a voltage is generated in the sensing electrode 1523 by the inverse piezoelectric effect of the second piezoelectric layer 1524 due to the ultrasonic waves US reflected by the finger, the difference between the bias voltage BV of the $k^{th}$ control voltage CVk and the voltage of the sensing electrode 1523 is equal to or lower than the threshold voltage of the lower channel of the second transistor T2. Therefore, the lower channel of the second transistor T2 may be deactivated.

When the sensing electrode 1523 has the gate-off voltage Voff of the first period t1 because the ultrasonic waves US are not reflected by the finger, the difference between the bias voltage BV of the $k^{th}$ control voltage CVk and the voltage of the sensing electrode 1523 is higher than the threshold voltage of the lower channel of the second transistor T2. Therefore, the lower channel of the second transistor T2 may be activated. When the lower channel of the second transistor T2 is activated, the sensing electrode 1523 may be charged with a difference between the bias voltage BV and the threshold voltage of the lower channel of the second transistor T2. In addition, because the second gate electrode G12 of the first transistor T1 is connected to the sensing electrode 1523, it may be charged with the difference between the bias voltage BV and the threshold voltage of the lower channel of the second transistor T2.

Figure 12:
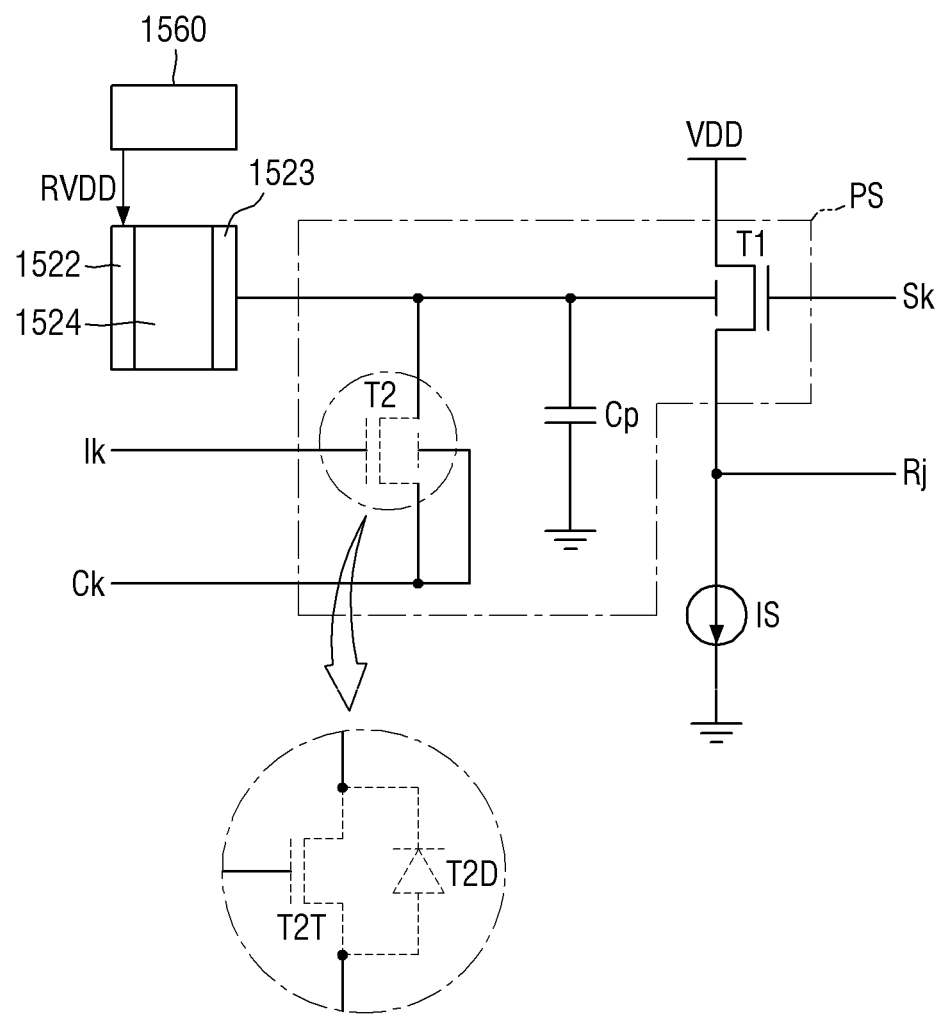

Third, referring to FIG. 12, during the third period t3, the kth selection signal SSk of the gate-on voltage Von is transmitted to the kth selection line Sk, the kth initialization signal ISk of the gate-off voltage Voff is transmitted to the kth initialization line Ik, and the kth control voltage CVk of the gate-off voltage Voff is applied to the kth control voltage line Ck.

Because the kth selection signal SSk of the gate-on voltage Von is transmitted to the first gate electrode G11 of the first transistor T1, the upper channel of the first transistor T1 is activated. A threshold voltage of the upper channel of the first transistor T1 may vary according to a voltage of the second gate electrode G12 of the first transistor T1.

Figure 15:
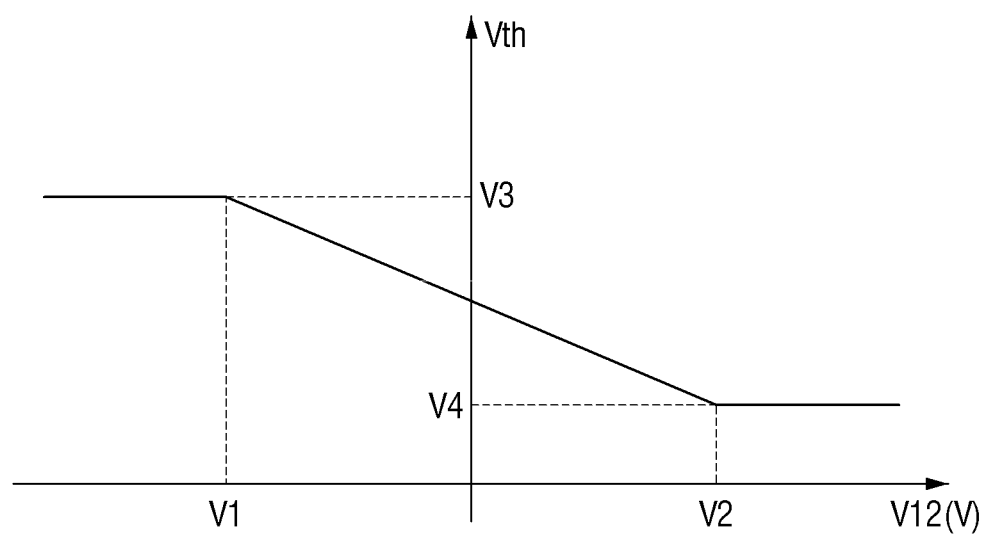
FIG. 15 is a graph illustrating a threshold voltage of a channel of the first transistor with respect to a voltage of a second gate electrode according to some example embodiments

FIG. 15 illustrates a threshold voltage Vth of the upper channel of the first active layer ACT1 of the first transistor T1 with respect to a voltage V12 of the second gate electrode G12 of the first transistor T1 when the upper channel of the first transistor T1 is activated by the gate-on voltage Von applied to the first gate electrode G11 of the first transistor T1. In FIG. 15, the X axis represents the voltage V12 of the second gate electrode G12 of the first transistor T1, and the Y axis represents the threshold voltage Vth of the upper channel of the first active layer ACT of the first transistor T1.

Referring to FIG. 15, when the voltage V12 of the second gate electrode G12 of the first transistor T1 is lower than a first voltage V1, the threshold voltage Vth of the upper channel of the first active layer ACT1 of the first transistor T1 has a third voltage V3. When the voltage V12 of the second gate electrode G12 of the first transistor T1 is higher than a second voltage V2, the threshold voltage Vth of the upper channel of the first active layer ACT1 of the first transistor T1 has a fourth voltage V4. The first voltage V1 may be lower than 0 V, and the second voltage V2 may be higher than 0 V. When the voltage V12 of the second gate electrode G12 of the first transistor T1 is between the first voltage V1 and the second voltage V2, the threshold voltage Vth of the upper channel of the first active layer ACT1 of the first transistor T1 is inversely proportional to the voltage V12 of the second gate electrode G12 of the first transistor T1. That is, when the voltage V12 of the second gate electrode G12 of the first transistor T1 is between the first voltage V1 and the second voltage V2, the threshold voltage Vth of the upper channel of the first active layer ACT1 of the first transistor T1 decreases as the voltage V12 of the second gate electrode G12 of the first transistor T1 increases.

Because the threshold voltage Vth of the upper channel of the first transistor T1 decreases as the voltage V12 of the second gate electrode G12 of the first transistor T1 increases, a driving current Ids flowing through the upper channel of the first transistor T1 (hereinafter, referred to as a "driving current Ids of the first transistor T1") may be changed according to the voltage V12 of the second gate electrode G12 of the first transistor T1.

Figure 16:
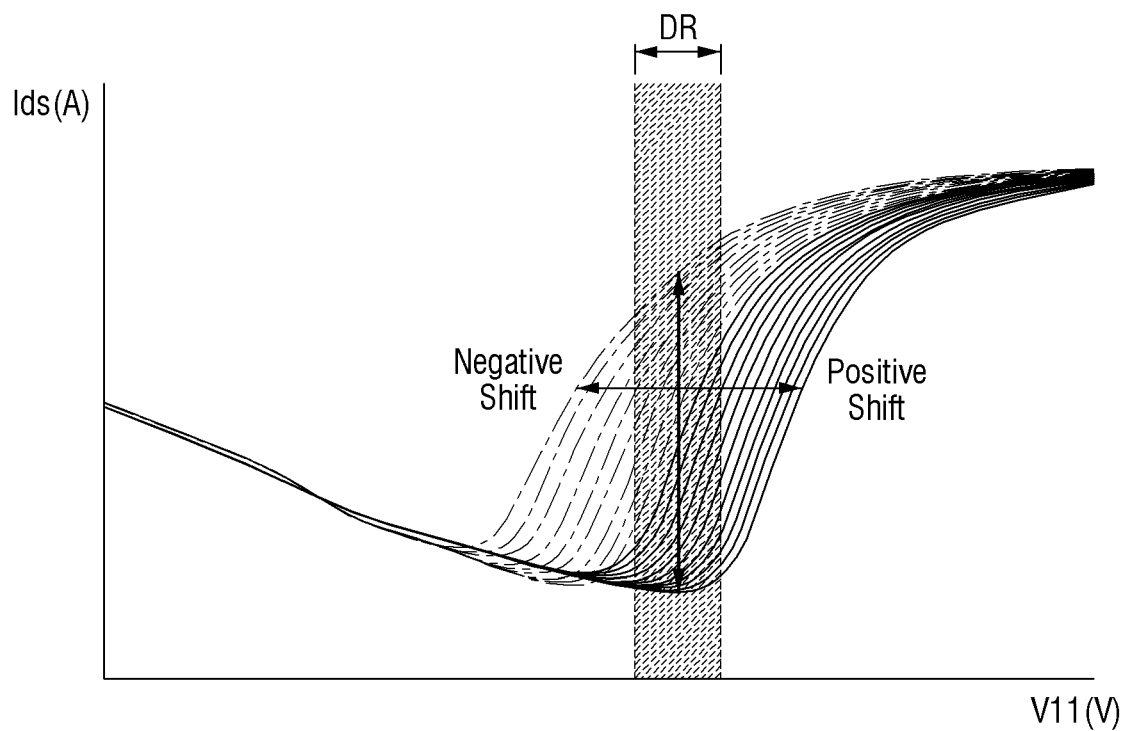
FIG. 16 is a graph illustrating a driving current of the channel of the first transistor with respect to a voltage of a first gate electrode when the voltage of the second gate electrode changes according to some example embodiments.

FIG. 16 illustrates the driving current Ids of the first transistor T1 with respect to a voltage V11 of the first gate electrode G11 of the first transistor T1 when the upper channel of the first transistor T1 is activated by the gate-on voltage Von applied to the first gate electrode G11 of the first transistor T1. In FIG. 16, the X axis represents the voltage V11 of the first gate electrode G11 of the first transistor T1, and the Y axis represents the driving current Ids of the upper channel of the first active layer ACT1 of the first transistor T1.

When the voltage V11 of the first gate electrode G11 is within a driving voltage range DR, a curve C of the driving current Ids of the first transistor T1 may be positively shifted as illustrated in FIG. 16 as the voltage V12 of the second gate electrode G12 of the first transistor T1 becomes closer to the first voltage V1 in FIG. 15. When the curve C is positively shifted, the driving current Ids of the first transistor T1 may decrease. The curve C of the driving current Ids of the first transistor T1 according to the voltage V12 of the second gate electrode G12 may be negatively shifted as illustrated in FIG. 16 as the voltage V12 of the second gate electrode G12 of the first transistor T1 becomes closer to the second voltage V2 in FIG. 15. When the curve C is negatively shifted, the driving current Ids of the first transistor T1 may increase. That is, the driving current Ids of the first transistor T1 may vary according to the voltage V12 of the second gate electrode G12.

When a voltage is generated in the sensing electrode 1523 by the inverse piezoelectric effect of the second piezoelectric layer 1524 due to ultrasonic waves US reflected by a finger, the voltage V12 of the second gate electrode G12 of the first transistor T1 is substantially the same as the voltage generated in the sensing electrode 1523. On the other hand, when the ultrasonic waves US are not reflected by the finger, the voltage V12 of the second gate electrode G12 of the first transistor T1 may be a difference between the bias voltage BV and the threshold voltage of the lower channel of the second transistor T2. That is, the voltage V12 of the second gate electrode G12 of the first transistor T1 may vary according to whether the ultrasonic waves US reflected by the finger are input to the second piezoelectric layer 1524, and the driving current Ids of the first transistor T1 may vary accordingly. Therefore, the voltage charged in the $j^{th}$ sensing line Rj by the driving current Ids of the first transistor T1 during the third period t3 may vary according to whether the ultrasonic waves US reflected by the finger are input to the second piezoelectric layer 1524.

Figure 13:
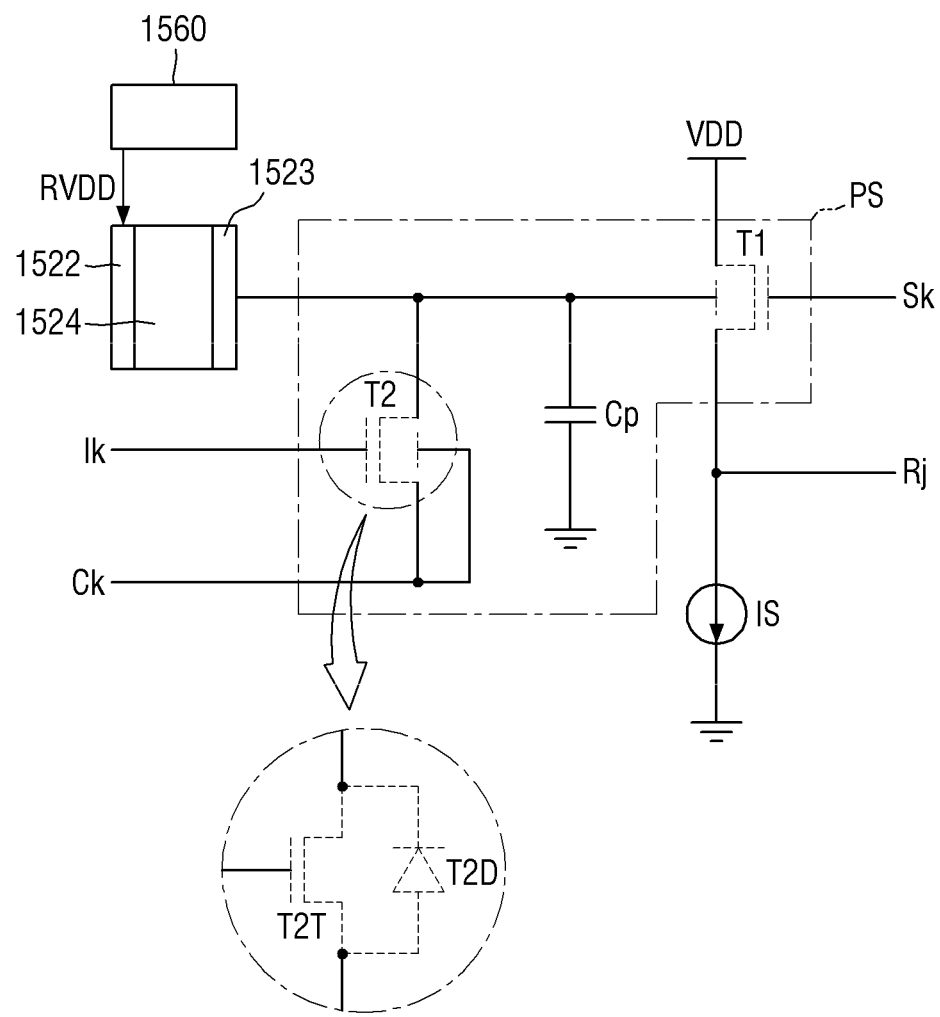

Fourth, referring to FIG. 13, during the fourth period t4, the $k^{th}$ initialization signal ISk of the gate-off voltage Voff is transmitted to the $k^{th}$ initialization line Ik, the $k^{th}$ selection signal SSk of the gate-off voltage Voff is transmitted to the $k^{th}$ selection line Sk, and the $k^{th}$ control voltage CVk of the gate-off voltage Voff is applied to the $k^{th}$ control voltage line Ck. Therefore, the first transistor T1 and the second transistor T2 of the pixel sensor PS are not turned on during the fourth period t4.

According to some example embodiments, as illustrated in FIG. 9, the second gate electrode G12 of the first transistor T1 of the pixel sensor PS is directly connected to the sensing electrode 1523. Therefore, the voltage charged in the jth sensing line Rj by the driving current Ids of the first transistor T1 may vary according to whether the ultrasonic waves US reflected by the finger are input to the second piezoelectric layer 1524. Thus, it is possible to recognize a user's fingerprint pattern or determine whether a user or an object is in proximity by using the sensing voltage of the jth sensing line Rj.

According to some example embodiments, as illustrated in FIG. 9, the first transistor T1 of the pixel sensor PS includes the first gate electrode G11 connected to the selection line Sk and the second gate electrode G12 connected to the sensing electrode 1523 and may be controlled by a selection signal and a voltage of the sensing electrode 1523. That is, the first transistor T1 may be a combination of a transistor controlled by the selection signal and a transistor controlled by the voltage of the sensing electrode 1523. Therefore, because the pixel sensor PS includes one transistor as the first transistor T1, the area of the pixel sensor PS may be reduced as compared when the pixel sensor PS includes two transistors.

According to some example embodiments, as illustrated in FIG. 9, the second transistor T2 of the pixel sensor PS includes the first gate electrode connected to the initialization line Ik and the second gate electrode and the first electrode connected to the control voltage line Ck. Therefore, the second transistor T2 may be a combination of the transistor T2T and the diode T2D as illustrated in FIG. 8. Because the pixel sensor PS includes one transistor, into which the transistor T2T and the diode T2D are combined, as the second transistor T2, the area of the pixel sensor PS may be reduced as compared with when the pixel sensor PS includes two elements, i.e., the transistor T2T and the diode T2D.

Figure 17:
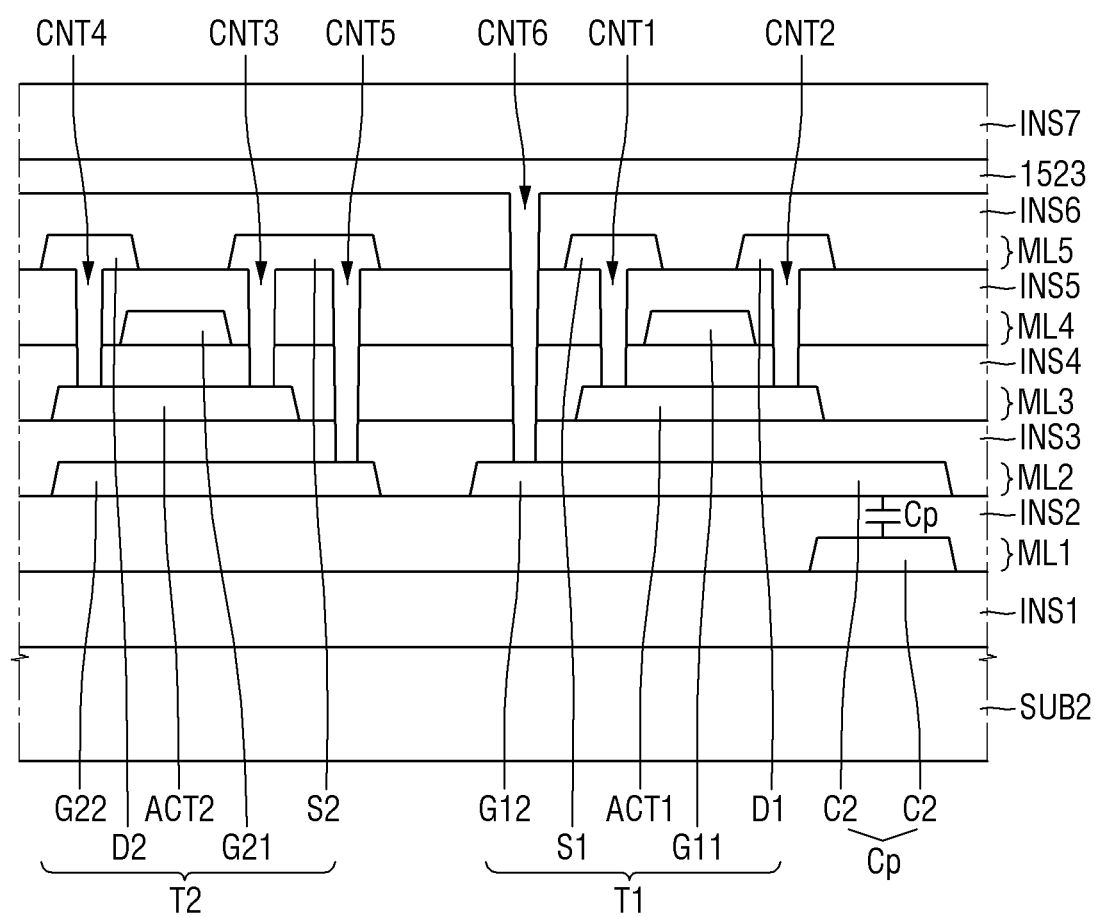
FIG. 17 is a cross-sectional view of an example of the pixel sensor of the ultrasonic sensing device of FIG. 8.

FIG. 17 is a cross-sectional view of an example of the pixel sensor PS of the ultrasonic sensing device 1520 of FIG. 8.

Referring to FIG. 17, the ultrasonic sensing device 1520 may include a second substrate SUB2, first through fifth metal layers ML1 through ML5 located on the second substrate SUB2, active layers ACT, and first through seventh insulating layers INS1 through INS7.

The second substrate SUB2 may be made of plastic or glass. The spacer 1530 may be located under the second substrate SUB2, and the ultrasonic emitting device 1510 may be located under the spacer 1530.

The first insulating layer INS1 may be formed in the second substrate SUB2. The first insulating layer INS1 may be formed on the second substrate SUB2 to protect transistors T1 and T2 and a capacitor Cp from moisture introduced through the substrate SUB2 which is vulnerable to moisture penetration. The first insulating layer INS1 may be a multilayer in which one or more inorganic layers selected from a silicon oxide (SiOx) layer, a silicon nitride (SiNx) layer, and SiON are alternately stacked.

The first metal layer ML1 including a second capacitor electrode CE2 of the capacitor Cp may be formed on the first insulating layer INS1. The first metal layer ML1 may be a single layer or a multilayer made of any one or more of molybdenum (Mo), aluminum (Al), chromium (Cr), gold (Au), titanium (T1), nickel (Ni), neodymium (Ne), copper (Cu), and alloys of the same.

The second insulating layer INS2 may be formed on the first metal layer ML1. The second insulating layer INS2 may be a multilayer in which one or more inorganic layers selected from a silicon oxide (SiOx) layer, a silicon nitride (SiNx) layer, and SiON are alternately stacked.

The second metal layer ML2 including a second gate electrode G12 of the first transistor T1, a second gate electrode G22 of the second transistor T2, and a first capacitor electrode CE1 of the capacitor Cp may be formed on the second insulating layer INS2. The second gate electrode G12 of the first transistor T1 and the first capacitor electrode CE1 are formed on the same layer. The second gate electrode G12 of the first transistor T1 and the first capacitor electrode CE1 directly contact each other. The first capacitor electrode CE1 may overlap the second capacitor electrode CE2 in the third direction (Z-axis direction) which is a thickness direction. The second metal layer ML2 may be a single layer or a multilayer made of any one or more of molybdenum (Mo), aluminum (Al), chromium (Cr), gold (Au), titanium (T1), nickel (Ni), neodymium (Ne), copper (Cu), and alloys of the same.

The third insulating layer INS3 may be formed on the second metal layer ML2. The third insulating layer INS3 may be a multilayer in which one or more inorganic layers selected from a silicon oxide (SiOx) layer, a silicon nitride (SiNx) layer, and SiON are alternately stacked.

The active layers ACT including a first active layer ACT1 of the first transistor T1 and a second active layer ACT2 of the second transistor T2 may be formed on the third insulating layer INS3. The first active layer ACT1 may overlap the second gate electrode G12 of the first transistor T1 in the third direction (Z-axis direction) which is the thickness direction. The second active layer ACT2 may overlap the second gate electrode G22 of the second transistor T2 in the third direction (Z-axis direction) which is the thickness direction. The active layers ACT may be made of a silicon-based semiconductor material or an oxide-based semiconductor material. For example, the active layers ACT may be made of any one of polysilicon, amorphous silicon, and oxide.

The fourth insulating layer INS4 may be formed on the active layers ACT. The fourth insulating layer INS4 may be a multilayer in which one or more inorganic layers selected from a silicon oxide (SiOx) layer, a silicon nitride (SiNx) layer, and SiON are alternately stacked.

The third metal layer ML3 including a first gate electrode G11 of the first transistor T1 and a first gate electrode G21 of the second transistor T2 may be formed on the fourth insulating layer INS4. The first gate electrode G11 of the first transistor T1 may overlap the first active layer ACT1 in the third direction (Z-axis direction) which is the thickness direction. The first gate electrode G21 of the second transistor T2 may overlap the second active layer ACT2 in the third direction (Z-axis direction) which is the thickness direction. The third metal layer ML3 may be a single layer or a multilayer made of any one or more of molybdenum (Mo), aluminum (Al), chromium (Cr), gold (Au), titanium (T1), nickel (Ni), neodymium (Ne), copper (Cu), and alloys of the same.

The fifth insulating layer INS5 may be formed on the third metal layer ML3. The fifth insulating layer INS5 may be a multilayer in which one or more inorganic layers selected from a silicon oxide (SiOx) layer, a silicon nitride (SiNx) layer, and SiON are alternately stacked.

The fourth metal layer ML4 including a first electrode S1 and a second electrode D1 of the first transistor T1 and a first electrode S2 and a second electrode D2 of the second transistor T2 may be formed on the fifth insulating layer INS5. The fourth metal layer ML4 may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

A first contact hole CNT1 may penetrate the fourth insulating layer INS4 and the fifth insulating layer INS5 to expose a portion of the first active layer ACT1. The first electrode S1 of the first transistor T1 may be connected to the first active layer ACT1 of the first transistor T1 through the first contact hole CNT1.

A second contact hole CNT2 may penetrate the fourth insulting layer INS4 and the fifth insulating layer INS5 to expose another portion of the first active layer ACT1. The second electrode D1 of the first transistor T1 may be connected to the first active layer ACT1 of the first transistor T1 through the second contact hole CNT2.

A third contact hole CNT3 may penetrate the fourth insulating layer INS4 and the fifth insulating layer INS5 to expose a portion of the second active layer ACT2. The first electrode S2 of the second transistor T2 may be connected to the second active layer ACT2 of the second transistor T2 through the third contact hole CNT3.

A fourth contact hole CNT4 may penetrate the fourth insulting layer INS4 and the fifth insulating layer INS5 to expose another portion of the second active layer ACT2. The second electrode D2 of the second transistor T2 may be connected to the second active layer ACT2 of the second transistor T2 through the fourth contact hole CNT4.

A fifth contact hole CNT5 may penetrate the third insulating layer INS3, the fourth insulating layer INS4 and the fifth insulating layer INS5 to expose the second gate electrode G22 of the second transistor T2. The first electrode S2 of the second transistor T2 may be connected to the second gate electrode G22 of the second transistor T2 through the fifth contact hole CNT5.

The sixth insulating layer INS6 may be formed on the fourth metal layer ML4. The sixth insulating layer INS6 may be a multilayer in which one or more inorganic layers selected from a silicon oxide (SiOx) layer, a silicon nitride (SiNx) layer, and SiON are alternately stacked.

The fifth metal layer ML5 including sensing electrodes 1523 may be formed on the sixth insulating layer INS6. The fifth metal layer ML5 may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

A sixth contact hole CNT6 may penetrate the third insulating layer INS3, the fourth insulating layer INS4 and the fifth insulating layer INS5 to expose the second gate electrode G12 of the first transistor T1. A sensing electrode 1523 may be connected to the second gate electrode G12 of the first transistor T1 through the sixth contact hole CNT6.

The seventh insulating layer INS7 may be formed on the fifth metal layer ML5. The seventh insulating layer INS7 may be a multilayer in which one or more inorganic layers selected from a silicon oxide (SiOx) layer, a silicon nitride (SiNx) layer, and SiON are alternately stacked.

The second piezoelectric layer 1524 may be located on the seventh insulating layer INS7, and the sensing driving electrode 1522 may be located on the second piezoelectric layer 1524. The protective layer 1525 may be located on the second sensing driving electrode 1522. The protective layer 1525 may be attached to the substrate SUB1 (see FIG. 4) of the display panel 300 using an adhesive member such as a PSA.

When the first ultrasonic sensor 510 and the second ultrasonic sensor 520 are integrally formed with the display panel 300, the substrate SUB1 (see FIG. 4) of the display panel 300 may be omitted. In this case, the buffer layer 302 (see FIG. 4) of the display panel 300 may be located on the protective layer 1525.

According to some example embodiments, as illustrated in FIG. 17, the first transistor T1 of the pixel sensor PS includes the first gate electrode G11 connected to a selection line Sk and the second gate electrode G12 connected to a sensing electrode 1523 and may be controlled by a selection signal and a voltage of the sensing electrode 1523. That is, the first transistor T1 may be a combination of a transistor controlled by the selection signal and a transistor controlled by the voltage of the sensing electrode 1523. Therefore, because the pixel sensor PS includes one transistor as the first transistor T1, the area of the pixel sensor PS may be reduced as compared when the pixel sensor PS includes two transistors.

According to some example embodiments, as illustrated in FIG. 17, the second transistor T2 of the pixel sensor PS includes the first gate electrode G21 connected to an initialization line Ik and the second gate electrode G22 and the first electrode S2 connected to a control voltage line Ck. Therefore, the second transistor T2 may be a combination of a transistor T2T and a diode T2D as illustrated in FIG. 8. Because the pixel sensor PS includes one transistor, into which the transistor T2T and the diode T2D are combined, as the second transistor T2, the area of the pixel sensor PS may be reduced as compared with when the pixel sensor PS includes two elements, i.e., the transistor T2T and the diode T2D.

According to some example embodiments, as illustrated in FIG. 17, the second gate electrode G12 of the first transistor T1 and the first capacitor electrode CE1 of the capacitor Cp are located on the same layer and directly contact and are connected to each other, and the first capacitor electrode CE1 overlaps the second capacitor electrode CE2 in the third direction (Z-axis direction) which is the thickness direction. Therefore, an area where the first transistor T1 and the capacitor Cp are formed can be minimized, thereby reducing the area of the pixel sensor PS.

Although certain example embodiments and implementations have been described herein, other embodiments and modifications will be apparent from this description. Accordingly, the inventive concepts are not limited to such embodiments, but rather to the broader scope of the appended claims, and their equivalents, and various obvious modifications and equivalent arrangements as would be apparent to a person of ordinary skill in the art.

What is claimed is:

1. An ultrasonic sensing device comprising:
   a sensing layer between a driving electrode and a sensing electrode; wherein the sensing layer is configured to generate an electrical signal according to an ultrasound; and
   a first transistor comprising a first gate electrode connected to a selection line and a second gate electrode connected to the sensing electrode, wherein the first gate electrode and the second gate electrode overlap each other in a direction, and a distance between the first gate electrode and an active area of the first transistor along the direction is less than a distance between the second gate electrode and the active area of the first transistor along the direction, and wherein as a voltage of the second gate electrode increases, a threshold voltage of an upper channel of an active layer of the first transistor decreases.

2. The ultrasonic sensing device of claim 1, further comprising a second transistor comprising a first gate electrode connected to an initialization line, a second gate electrode and a first electrode connected to a control voltage line, and a second electrode connected to the sensing electrode.

3. The ultrasonic sensing device of claim 2, wherein the driving electrode, the sensing electrode, and the sensing layer are on the first transistor and the second transistor.

4. The ultrasonic sensing device of claim 2, wherein the second transistor is configured to be turned on during a first period to initialize a voltage of the second gate electrode of the first transistor and a voltage of the sensing electrode.

5. The ultrasonic sensing device of claim 4, wherein, during the first period, a selection signal of a gate-off voltage is transmitted to the selection line, an initialization signal of a gate-on voltage is transmitted to the initialization line, and a control voltage of the gate-off voltage is applied to the control voltage line.

6. The ultrasonic sensing device of claim 4, wherein, during a second period after the first period, a sensing voltage of the sensing electrode generated by the sensing layer is applied to the second gate electrode of the first transistor.

7. The ultrasonic sensing device of claim 6, wherein, during the second period, a selection signal of a gate-off voltage is transmitted to the selection line, an initialization signal of the gate-off voltage is transmitted to the initialization line, and a control voltage of a bias voltage between a gate-on voltage and the gate-off voltage is applied to the control voltage line.

8. The ultrasonic sensing device of claim 6, wherein, during a third period after the second period, the first transistor is turned on, and a driving current flowing through a channel of the first transistor varies according to the sensing voltage applied to the second gate electrode of the first transistor.

9. The ultrasonic sensing device of claim 8, wherein, during the third period, a selection signal of a gate-on voltage is transmitted to the selection line, an initialization signal of a gate-off voltage is transmitted to the initialization line, and a control voltage of the gate-off voltage is applied to the control voltage line.

10. The ultrasonic sensing device of claim 8, wherein a threshold voltage of the first transistor decreases as the sensing voltage applied to the second gate electrode of the first transistor increases.

11. The ultrasonic sensing device of claim 8, wherein, when a selection signal of a gate-on voltage is transmitted to the first gate electrode of the first transistor, the driving current decreases as the sensing voltage applied to the second gate electrode of the first transistor increases.

12. The ultrasonic sensing device of claim 2, further comprising a first insulating layer on a second capacitor electrode, wherein the second gate electrode of the first transistor, the second gate electrode of the second transistor, and a first capacitor electrode are on the first insulating layer.

13. The ultrasonic sensing device of claim 12, further comprising a second insulating layer on the second gate electrode of the first transistor, the second gate electrode of the second transistor, and the first capacitor electrode, wherein the active layer of the first transistor and an active layer of the second transistor are on the second insulating layer.

14. The ultrasonic sensing device of claim 13, further comprising a third insulating layer on the active layer of the first transistor and the active layer of the second transistor, wherein the first gate electrode of the first transistor and the first gate electrode of the second transistor are on the third insulating layer.

15. The ultrasonic sensing device of claim 14, further comprising a fourth insulating layer on the first gate electrode of the first transistor and the first gate electrode of the second transistor, wherein the first electrode and the second electrode of the first transistor and the first electrode and the second electrode of the second transistor are on the fourth insulating layer.

16. The ultrasonic sensing device of claim 15, wherein the first electrode and the second electrode of the first transistor are respectively connected to the active layer of the first transistor through a first contact hole and a second contact hole penetrating the fourth insulating layer.

17. The ultrasonic sensing device of claim 15, wherein the first electrode and the second electrode of the second transistor are respectively connected to the active layer of the second transistor through a third contact hole and a fourth contact hole penetrating the fourth insulating layer.

18. The ultrasonic sensing device of claim 15, wherein the first electrode of the second transistor is connected to the second gate electrode of the second transistor through a fifth contact hole penetrating the second insulating layer and the fourth insulating layer.

19. The ultrasonic sensing device of claim 15, further comprising a fifth insulating layer on the first electrode and the second electrode of the first transistor and the first electrode and the second electrode of the second transistor, wherein the sensing electrode is on the fifth insulating layer.

20. The ultrasonic sensing device of claim 19, wherein the sensing electrode is connected to the second gate electrode of the first transistor through a sixth contact hole penetrating the second insulating layer, the fourth insulating layer and the fifth insulating layer.

21. The ultrasonic sensing device of claim 19, wherein the sensing layer is on the sensing electrode, and the driving electrode is on a piezoelectric layer.

22. The ultrasonic sensing device of claim 1, wherein the sensing layer includes a piezoelectric material having a piezoelectric effect.

23. An ultrasonic sensing device comprising:

a sensing layer between a driving electrode and a sensing electrode, wherein the sensing layer is configured to generate an electrical signal according to an ultrasound;

a first transistor comprising a first gate electrode connected to a selection line a second gate electrode connected to the sensing electrode, and an active layer under the first gate electrode and on the second gate electrode; and a capacitor comprising a first capacitor electrode connected to the second gate electrode of the first transistor and a second capacitor electrode configured to receive a second driving voltage, and wherein the second gate electrode of the first transistor and the first capacitor electrode are on a same layer, and the second capacitor electrode is under the first capacitor electrode.

24. The ultrasonic sensing device of claim 23, wherein the first transistor further comprises a first electrode connected to a sensing line and a second electrode connected to a first driving voltage line configured to receive a first driving voltage.

25. An ultrasonic sensing device comprising:
a sensing layer between a driving electrode and a sensing electrode, wherein the sensing layer is configured to generate an electrical signal according to an ultrasound; and
a second transistor comprising a first gate electrode connected to an initialization line, a second gate electrode and a first electrode connected to a control voltage line, and a second electrode connected to the sensing electrode,
further comprising a capacitor comprising a first capacitor electrode connected to the sensing electrode and a second capacitor electrode connected to a second driving voltage line to which a second driving voltage is applied,
wherein the second gate electrode of the second transistor and the first capacitor electrode are on a same layer, and the second capacitor electrode is under the first capacitor electrode.

26. The ultrasonic sensing device of claim 25, wherein the sensing layer includes a piezoelectric material having a piezoelectric effect.

27. The ultrasonic sensing device of claim 25, further comprising a first transistor comprising a first gate electrode connected to a selection line, a second gate electrode connected to the sensing electrode, a first electrode connected to a sensing line; and a second electrode connected to a first driving voltage line to which a first driving voltage is applied.

* * * * *